(12) United States Patent
Kim et al.

(10) Patent No.: US 11,088,356 B2
(45) Date of Patent: Aug. 10, 2021

(54) DISPLAY APPARATUS AND METHOD OF MANUFACTURING THE SAME

(71) Applicant: Samsung Display Co., Ltd., Yongin-si (KR)

(72) Inventors: Woongsik Kim, Yongin-si (KR); Taewook Kang, Yongin-si (KR); Jeongmin Park, Yongin-si (KR); Hyeyong Chu, Yongin-si (KR); Hoon Kang, Yongin-si (KR); Hyunju Kang, Yongin-si (KR); Janghyun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/707,818

(22) Filed: Dec. 9, 2019

(65) Prior Publication Data
US 2020/0274109 A1     Aug. 27, 2020

(30) Foreign Application Priority Data

Feb. 22, 2019    (KR) .................. 10-2019-0021289

(51) Int. Cl.
| | | |
|---|---|---|
| *H01L 51/56* | (2006.01) | |
| *H01L 51/52* | (2006.01) | |
| *H01L 51/00* | (2006.01) | |

(52) U.S. Cl.
CPC .......... *H01L 51/56* (2013.01); *H01L 51/0017* (2013.01); *H01L 51/5253* (2013.01); *H01L 51/5275* (2013.01)

(58) Field of Classification Search
CPC .............................. H01L 51/56; H01L 51/524
See application file for complete search history.

(56) References Cited

U.S. PATENT DOCUMENTS

| | | |
|---|---|---|
| 5,754,342 A | 5/1998 | Ohnishi et al. |
| 7,473,932 B2 | 1/2009 | Cho et al. |

(Continued)

FOREIGN PATENT DOCUMENTS

| | | | |
|---|---|---|---|
| JP | 5-249449 A | 9/1993 | |
| JP | 7-181470 A | 7/1995 | |

(Continued)

*Primary Examiner* — Michele Fan
(74) *Attorney, Agent, or Firm* — Lewis Roca Rothgerber Christie LLP

(57) ABSTRACT

In a method of manufacturing a display apparatus, the method includes: providing a first mother substrate; forming, on the first mother substrate, a pixel layer comprising a light-emitting device; providing a second mother substrate; forming, on the second mother substrate, a diffraction pattern layer configured to diffract light emitted from the light-emitting device; forming a bonded substrate structure by bonding the first mother substrate, on which the pixel layer is formed, and the second mother substrate, on which the diffraction pattern layer is formed; forming, by cutting the bonded substrate structure, a plurality of unit substrate structures each comprising a first substrate on which the pixel layer is formed and a second substrate on which the diffraction pattern layer is formed; forming a protection member on the diffraction pattern layer; and removing a foreign material on the diffraction pattern layer with the protection member.

18 Claims, 22 Drawing Sheets

(56) References Cited

U.S. PATENT DOCUMENTS

| | | | |
|---|---|---|---|
| 2007/0009223 A1* | 1/2007 | Rudmann | H01L 27/14687 385/147 |
| 2008/0037084 A1* | 2/2008 | Kobayashi | G02B 5/32 359/15 |
| 2014/0124761 A1* | 5/2014 | Jeon | H01L 27/3244 257/40 |
| 2018/0314067 A1 | 11/2018 | Cho et al. | |

FOREIGN PATENT DOCUMENTS

| | | |
|---|---|---|
| JP | 2007-322575 A | 12/2007 |
| KR | 10-2006-0030396 A | 4/2006 |
| KR | 10-2018-0121750 A | 11/2018 |

* cited by examiner

DISPLAY APPARATUS AND METHOD OF MANUFACTURING THE SAME

CROSS-REFERENCE TO RELATED APPLICATION

This application claims priority to and the benefit of Korean Patent Application No. 10-2019-0021289, filed on Feb. 22, 2019, in the Korean Intellectual Property Office, the disclosure of which is incorporated herein in its entirety by reference.

BACKGROUND

1. Field

Aspects of one or more embodiments relate to a display apparatus and a method of manufacturing the display apparatus.

2. Description of the Related Art

The importance of display apparatuses has increased along with the development of multimedia. In response to the increased importance of display apparatuses, various kinds of display apparatuses such as liquid crystal displays (LCDs) and organic light-emitting displays (OLEDs) have been used.

Among display apparatuses, an organic light-emitting display displays an image by using an organic light-emitting device that emits light by recombination of electrons and holes. Organic light-emitting displays have characteristics such as relatively high response speeds, relatively high luminance, relatively wide viewing angles, and at the same time, may be driven with relatively small power consumption.

The above information disclosed in this Background section is only for enhancement of understanding of the background and therefore it may contain information that does not constitute prior art.

SUMMARY

Aspects of one or more example embodiments include a display apparatus in which an effective emission area ratio may be increased and visibility defects due to foreign materials may be minimized or reduced and a method of manufacturing the display apparatus.

Additional aspects will be set forth in part in the description which follows and, in part, will be apparent from the description, or may be learned by practice of the presented embodiments.

According to some example embodiments, a method of manufacturing an apparatus includes: providing a first mother substrate; forming, on the first mother substrate, a pixel layer including a light-emitting device; providing a second mother substrate; forming, on the second mother substrate, a diffraction pattern layer diffracting light emitted from the light-emitting device; forming a sealed substrate structure by bonding the first mother substrate, on which the pixel layer is formed, and the second mother substrate on which the diffraction pattern layer is formed; forming, by cutting the bonded substrate structure, a plurality of unit substrate structures each including a first substrate on which the pixel layer is formed and a second substrate on which the diffraction pattern layer is formed; forming, on the diffraction pattern layer, a protection member preventing a foreign material; and removing the foreign material on the diffraction pattern layer.

According to some example embodiments, the forming of the protection member may include forming a sacrificial layer on the diffraction pattern layer, and the removing of the foreign material may include removing the sacrificial layer.

According to some example embodiments, the forming of the protection member may include forming a coating layer above the diffraction pattern layer, and the removing of the foreign material may include cleaning the coating layer.

According to some example embodiments, the forming of the protection member may include forming a sacrificial layer covering the diffraction pattern layer, between the forming of the diffraction pattern layer and the forming of the bonded substrate structure, and the removing of the foreign material may include removing the sacrificial layer after the forming of the unit substrate structures.

According to some example embodiments, the method may further include performing seal printing and baking on a surface that is opposite to a surface at which the sacrificial layer of the second mother substrate is formed, between the forming of the sacrificial layer and the forming of the bonded substrate structure.

According to some example embodiments, the method may further include, between the forming of the bonded substrate structure and the forming of the unit substrate structures: forming a protection layer on the sacrificial layer of the second mother substrate; slimming the first mother substrate; removing the protection layer on the second mother substrate; cleaning the bonded substrate structure; and forming a protection layer on the first mother substrate.

According to some example embodiments, the method may further include polishing the plurality of unit substrate structures, between the forming of the plurality of unit substrate structures and the removing of the sacrificial layer.

According to some example embodiments, the forming of the protection member may include forming a sacrificial layer covering the diffraction pattern layer, between the forming of the diffraction pattern layer and the forming of the bonded substrate structure; and the removing of the foreign material may include removing the sacrificial layer, between the forming of the bonded substrate structure and the forming of the plurality of unit substrate structures.

According to some example embodiments, the method may further include, between the forming of the bonded substrate structure and the removing of the sacrificial layer: forming a protection layer on the sacrificial layer of the second mother substrate; slimming the first mother substrate; removing the protection layer of the second mother substrate; cleaning the bonded substrate structure; and forming a protection layer on the first mother substrate.

According to some example embodiments, the method may include forming the plurality of unit substrate structures after the removing of the sacrificial layer.

According to some example embodiments, the forming of the protection member may include forming a sacrificial layer covering the diffraction pattern layer after the forming of the bonded substrate structure, and the removing of the foreign material may include removing the sacrificial layer, between the forming of the sacrificial layer and the forming of the plurality of unit substrate structures.

According to some example embodiments, the method may further include, between the forming of the sacrificial layer and the removing of the sacrificial layer: forming a protection layer on the sacrificial layer of the second mother substrate; slimming the first mother substrate; removing the protection layer of the second mother substrate; cleaning the bonded substrate structure; and forming a protection layer on the first mother substrate.

According to some example embodiments, the method may include forming the plurality of unit substrate structures after the removing of the sacrificial layer.

According to some example embodiments, the forming of the protection member may include forming a sacrificial layer covering the diffraction pattern layer, between the forming of the bonded substrate structure and the forming of the plurality of unit substrate structures, and the removing of the foreign material may include removing the sacrificial layer after the forming of the plurality of unit substrate structures.

According to some example embodiments, the method may further include, between the forming of the sacrificial layer and the forming of the plurality of unit substrate structures: forming a protection layer on the sacrificial layer of the second mother substrate; slimming the first mother substrate; removing the protection layer of the second mother substrate; cleaning the bonded substrate structure; and forming a protection layer on the first mother substrate.

According to some example embodiments, the forming of the protection member may include forming a coating layer covering the diffraction pattern layer between the forming of the bonded substrate structure and the forming of the plurality of unit substrate structures, and the removing of the foreign material may include cleaning the coating layer after the forming of the plurality of unit substrate structures.

According to some example embodiments, the method may further include, between the forming of the bonding substrate structure and the forming of the plurality of unit substrate structures: forming a protection layer above the diffraction pattern layer of the second mother substrate; slimming the first mother substrate; removing the protection layer of the second mother substrate; cleaning the bonded substrate structure; and forming a protection layer on the first mother substrate.

According to some example embodiments, the method may further include polishing the plurality of unit substrate structures between the forming of the plurality of unit substrate structures and the cleaning of the coating layer.

According to some example embodiments, a display apparatus includes: a first substrate on which a pixel layer including a light-emitting device is arranged; an encapsulation layer on the pixel layer; a diffraction pattern layer diffracting light emitted from the light-emitting device onto the encapsulation layer; and a protection member on the diffraction pattern layer.

According to some example embodiments, the protection member may include a water repellent material and an oil repellent material.

BRIEF DESCRIPTION OF THE DRAWINGS

These and/or other aspects will become apparent and more readily appreciated from the following description of aspects of some example embodiments, taken in conjunction with the accompanying drawings in which.

DETAILED DESCRIPTION

Figure 1:
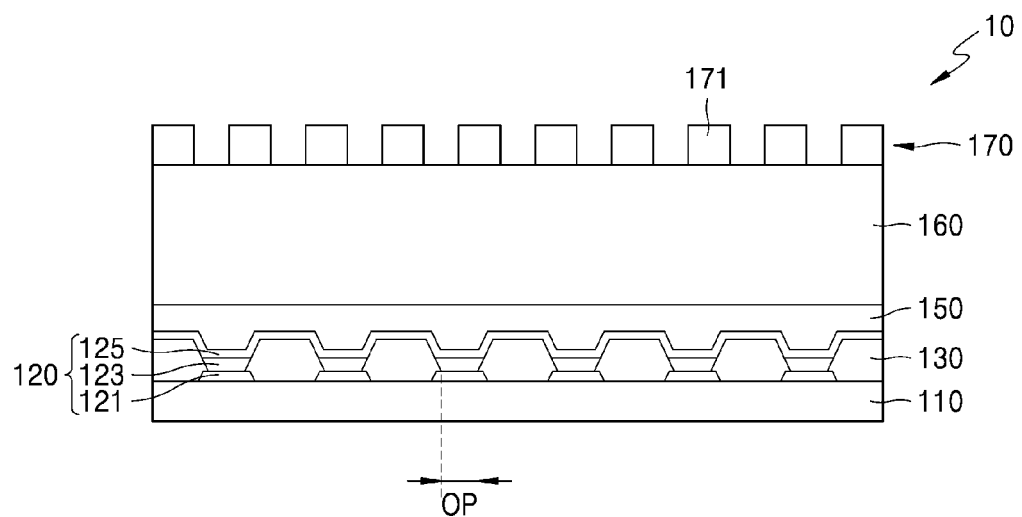
FIG. 1 is a cross-sectional view schematically illustrating a display apparatus according to some example embodiments.

As the embodiments allow for various changes and numerous embodiments, some example embodiments will be illustrated in the drawings and described in some detail in the written description. Features of some example embodiments and a method of achieving the features may become more apparent with reference to example embodiments described in some detail with the attached drawings. However, the embodiments are not limited to the example embodiments set forth herein and may be embodied in various forms.

Hereinafter, aspects of some example embodiments will be described in more detail with reference to the attached drawings. Like reference numerals denote like components, and repeated descriptions thereof will be omitted.

It will be understood that although terms "first," "second," etc. may be used herein to describe various components, these components should not be limited by these terms. These terms are only used to distinguish one component from another.

As used herein, the singular forms "a," "an," and "the" are intended to include the plural forms as well, unless the context clearly indicates otherwise.

It will be further understood that the terms "including" and/or "having" used herein specify the presence of stated features or components, but do not preclude the presence or addition of one or more other features or components.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to or different from the described order, unless otherwise stated explicitly or implicitly.

In embodiments set forth herein, when a layer, region, or component is connected to another layer, region, or component, the layers, regions, or components may be directly connected to each other, and the layers, regions, or components may also be indirectly connected to each other with another layer, region, or component therebetween. For example, in the present specification, when a layer, region, or component is electrically connected to another layer, region, or component, the layers, regions, or components may be directly and electrically connected to each other, and the layers, regions, or components may also be indirectly and electrically connected to each other with another layer, region, or component therebetween.

Figure 2:
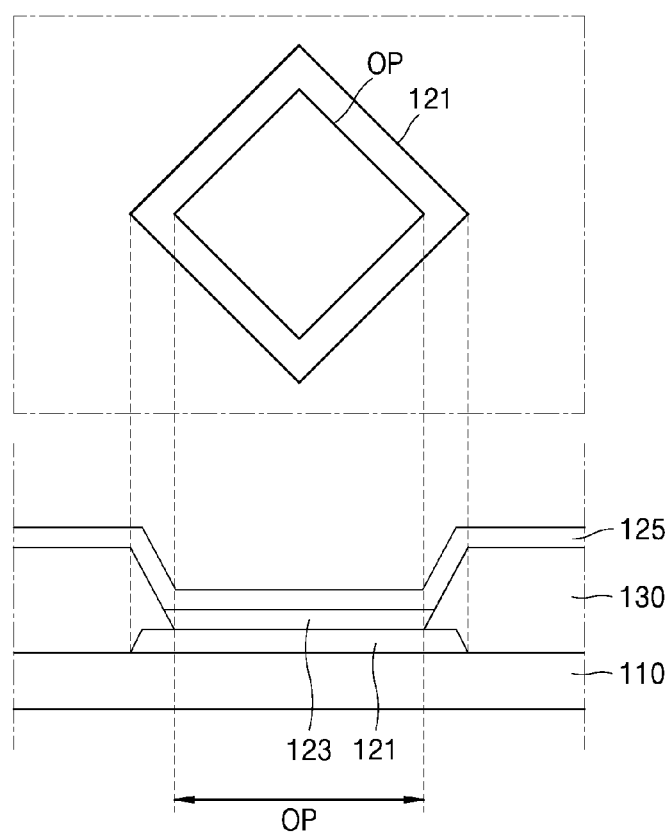
FIG. 2 is an enlarged view showing a plane and a cross-section of a light-emitting device shown in FIG. 1.

FIG. 1 is a cross-sectional view schematically illustrating a display apparatus 10 according to some example embodiments. FIG. 2 is an enlarged view showing a plane and a cross-section of a light-emitting device shown in FIG. 1.

Hereinafter, an organic light-emitting display apparatus is described as an example of the display apparatus 10 according to some example embodiments, but the display apparatus 10 according to the embodiments is not limited thereto. According to some example embodiments, various types of display apparatuses such as an inorganic light-emitting display (or an inorganic EL display, an inorganic light-emitting display) or a quantum dot light-emitting display may be used.

Referring to FIGS. 1 and 2, the display apparatus 10 according to some example embodiments may include a substrate 110, a pixel layer in which a light-emitting device 120 is arranged, an encapsulation layer 160 above the pixel layer, and a diffraction pattern layer 170.

The substrate 110 may include various materials such as glass, metal, and plastic. may include an insulating substrate. For example, the substrate 110 may include a polymer resin such as polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP). The substrate 110 may include a flexible substrate.

A plurality of the light-emitting devices 120 may be arranged in the pixel layer on the substrate 110. The light-emitting devices 120 may include a first electrode 121 which is a pixel electrode, an intermediate layer 123, and a second electrode 125 which is an opposite electrode. According to some example embodiments, in the pixel layer, at least one insulating layer and a pixel circuit electrically connected to the light-emitting device 120 may be arranged between the substrate 110 and the light-emitting device 120. The pixel circuit may include at least one thin film transistor and a capacitor.

The first electrode 121 may include a conductive oxide such as indium tin oxide (ITO), indium zinc oxide (IZO), zinc oxide (ZnO), indium oxide ($In_2O_3$), indium gallium oxide (IGO), and aluminum zinc oxide (AZO). As another embodiment, the first electrode 121 may include a reflective film including silver (Ag), magnesium (Mg), aluminum (Al), platinum (Pt), palladium (Pd), gold (Au), nickel (Ni), neodymium (Nd), iridium (Ir), chromium (Cr), or combinations thereof. As another embodiment, the first electrode 121 may further include a film including ITO, IZO, ZnO, or $In_2O_3$ on/under the reflective film.

An edge of the first electrode 121 may be covered by a pixel defining layer 130. The pixel defining layer 130 may include an opening OP that exposes a portion of the first electrode 121. The pixel defining layer 130 may include an organic material or an inorganic material. As an embodiment, the pixel defining layer 130 may include a material such as photoresist, polyimide resin, acryl resin, a silicon compound, polyacryl resin.

FIG. 2 shows an embodiment in which the first electrode 121 and the opening OP have an approximately rhombus shape. The shapes of the first electrode 121 and the opening OP may vary according to an arrangement of the light-emitting device 120 and the like.

The intermediate layer 123 includes an emission layer. The emission layer may include a polymer organic material or a low molecular weight organic material which emits light of certain colors. In an embodiment, the intermediate layer 123 may include a first function layer that is arranged under the emission layer and/or a second function layer that is arranged on the emission layer. The first function layer and/or the second function layer may include a layer integrally formed over a plurality of the first electrodes 121, or may include a layer that is patterned to correspond to the plurality of first electrodes 121.

The first function layer may include a single layer or a multi-layer. For example, when the first function layer includes a polymer material, the first function layer may be a hole transport layer (HTL) having a single layer structure and include poly-(3,4)-ethylene-dihydroxy thiophene) or polyaniline (PANI). When the first function layer includes a low molecular weight material, the first function layer may include a hole injection layer (HIL) and a hole transport layer (HTL).

The second function layer is not necessarily provided. For example, when the first function layer and the emission layer each include a polymer material, it is desirable to form the second function layer to impart excellent characteristics to an organic light-emitting diode. The second function layer may include a single layer or a multi-layer. The second function layer may include an electron transport layer (ETL) and/or an electron injection layer (EIL).

The second electrode 125 is arranged to face the first electrode 121 with the intermediate layer 123 therebetween. The second electrode 125 may include a conductive material which has a small work function. For example, the second electrode 125 may include a translucent layer including Ag, Mg, Al, Pt, Pd, Au, Ni, Nd, Ir, Cr, lithium (Li), calcium (Ca), or alloys thereof. Alternatively, the second electrode 125 may further include a layer which includes ITO, IZO, ZnO, and $In_2O_3$ on the translucent layer which includes the above-described materials. The second electrode 125 may be integrally formed with the plurality of light-emitting devices 120 and face the plurality of first electrodes 121.

The buffer layer 150 may be arranged on the second electrode 125. The are stacked in a single layer or a multi-layer structure. According to some example embodiments, the buffer layer 150 may also include an air layer. When the buffer layer 150 is an air layer, no particular configuration is arranged between the second electrode 125 and the encapsulation layer 160. According to some example embodiments, the buffer layer 150 may also be used for adjusting a distance between the diffraction pattern layer 170, which will be described later, and the plurality of light-emitting devices 120.

According to some example embodiments, a capping layer may be arranged on the second electrode 125. The capping layer may prevent light incident on the second electrode 125 from being lost due to total reflection. According to some example embodiments, the capping layer may include an organic layer or an inorganic layer.

The encapsulation layer 160 may be arranged to cover the plurality of light-emitting devices 120. That is, the plurality of light-emitting devices 120 may be arranged between the first substrate 110 and the encapsulation layer 160. The encapsulation layer 160 may protect the light-emitting devices 120 from external oxygen or moisture.

According to some example embodiments, the encapsulation layer 160 may include a transparent insulating substrate. The encapsulation layer 160 may include a glass substrate, a quartz substrate, a transparent resin substrate, and so on. A sealing member may be provided between the encapsulation layer 160 and the substrate 110 bonding the encapsulation layer 160 and the substrate 110. According to some example embodiments, the encapsulation layer 160 may include at least one organic encapsulation layer and at least one inorganic encapsulation layer. For example, the encapsulation layer 160 may include a first inorganic encapsulation layer/an organic encapsulation layer/a second inorganic encapsulation layer. The number of organic encapsulation layers, the number of inorganic encapsulation layers, and an order of stacking the layers may be modified. The first inorganic encapsulation layer and the second inorganic encapsulation layer may each include more than one inorganic insulating materials from among aluminum oxide, titanium oxide, tantalum oxide, hafnium oxide, zinc oxide, silicon oxide, silicon nitride, and silicon oxynitride. The organic encapsulation layer may include polymeric materials. The polymeric materials may include an acrylic resin, an epoxy resin, polyimide, polyethylene, and the like.

The diffraction pattern layer 170 may be arranged on the encapsulation layer 160. The diffraction pattern layer 170 may be arranged on a path of light emitted from the plurality of light-emitting devices 120. The diffraction pattern layer 170 may include a plurality of diffraction patterns 171. The plurality of diffraction patterns 171 may diffract the light emitted from the light-emitting devices 120 and increase an emission area. The plurality of diffraction patterns 171 may include periodic patterns. The plurality of diffraction patterns 171 may all have a same shape. The diffraction pattern layer 170 may include an inorganic material such as silicon nitride. In an embodiment, the diffraction pattern layer 170 may be formed by etching an upper surface of the inorganic encapsulation layer included in the encapsulation layer 160. In another embodiment, the diffraction pattern layer 170 may be separately provided on the encapsulation layer 160. According to some example embodiments, a buffer layer may be further provided between the diffraction pattern layer 170 and the encapsulation layer 160. The buffer layer may include a single layer or a multi-layer structure which includes at least one organic layer and at least one inorganic layer.

Figure 3:
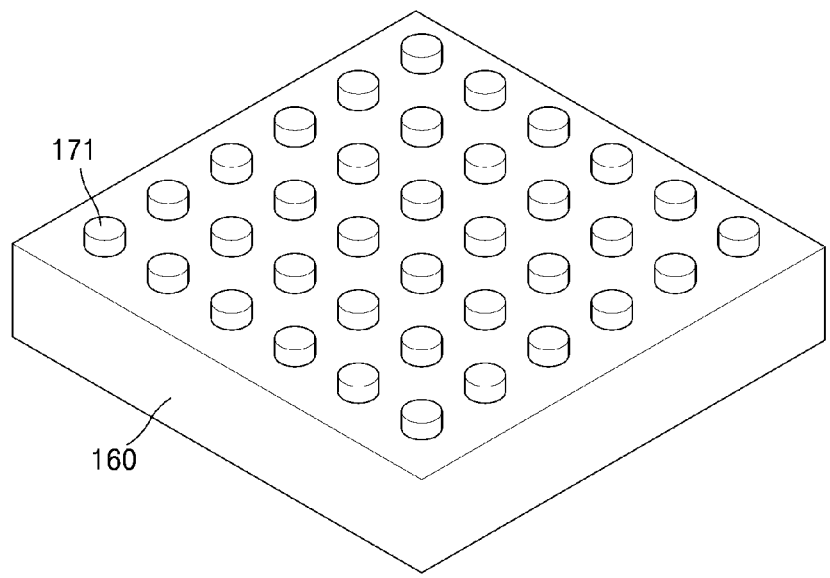
FIG. 3 is a schematic perspective view showing an encapsulation layer and a diffraction pattern layer according to some example embodiments.
Figure 4:
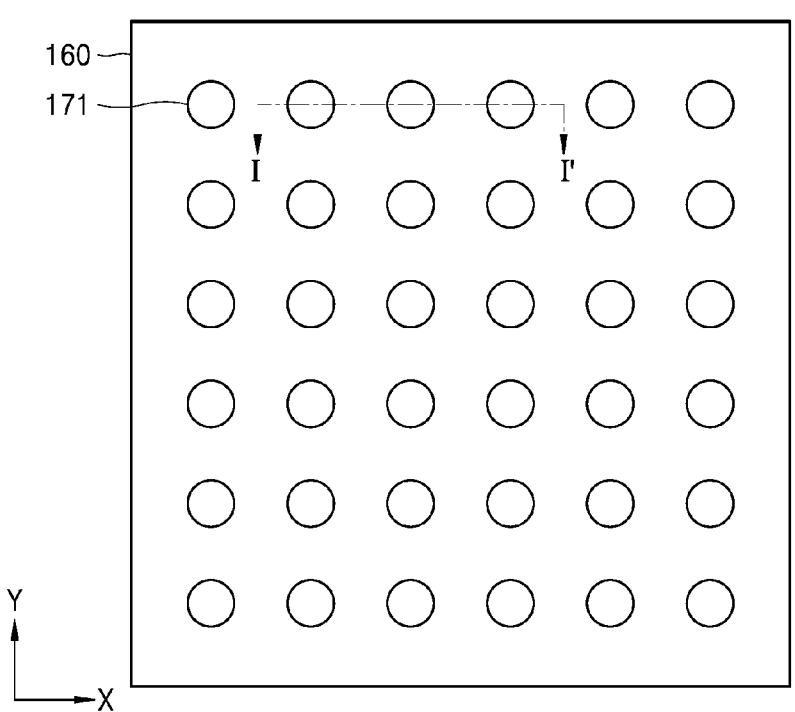
FIG. 4 is a top-plan view of the diffraction pattern layer shown in FIG. 3.
Figure 5:
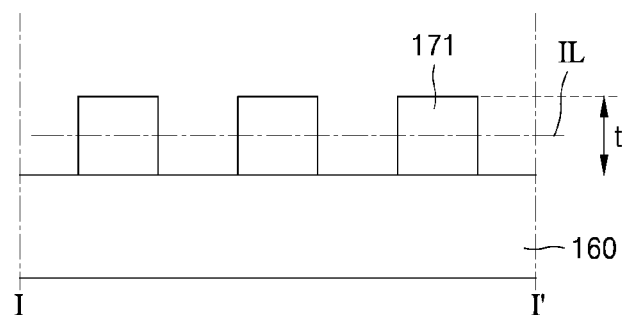
FIG. 5 is a cross-sectional view of a portion of the diffraction pattern layer taken along the line I-I' shown in FIG. 4.
Figure 6:
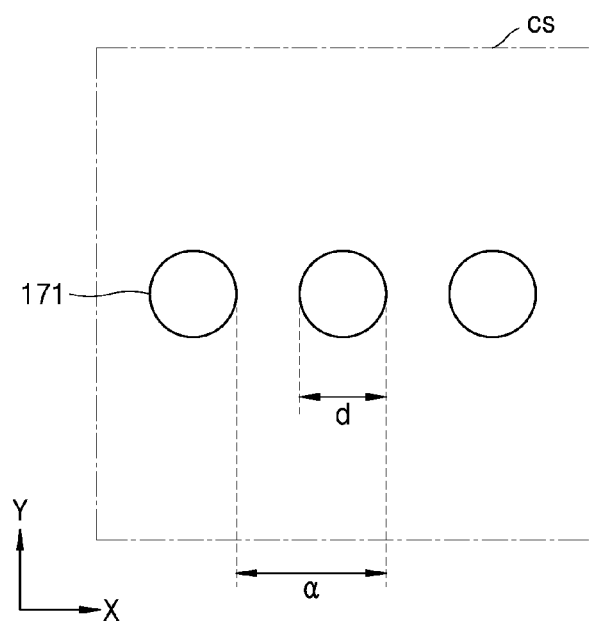
FIG. 6 is a cross-sectional view showing a portion of the diffraction pattern layer taken along the imaginary line IL shown in FIG. 5.

FIG. 3 is a schematic perspective view showing the encapsulation layer 160 and the diffraction pattern layer 170 according to some example embodiments. FIG. 4 is a top-plan view of the diffraction pattern layer 170 shown in FIG. 3. FIG. 5 is a cross-sectional view a portion of the diffraction pattern layer 170 taken along the line I-I' shown in FIG. 4. FIG. 6 is a cross-sectional view showing a portion of the diffraction pattern layer 170 taken along an imaginary line IL shown in FIG. 5.

Referring to FIGS. 3 through 6, the diffraction pattern layer 170 may include the plurality of diffraction patterns 171 arranged on the encapsulation layer 160. The diffraction pattern 171 may have a thickness (e.g., a predetermined thickness) t. The thickness t denotes a distance from a bottom surface to a top surface of the diffraction pattern 171. The diffraction pattern 171 may have a certain length d. The length d denotes a width of a cross-section of the diffraction pattern 171. The diffraction patterns 171 may be arranged to have a certain period α. The period α denotes a distance from a side of one diffraction pattern 171 to a side of the other diffraction pattern 171 from among two diffraction patterns 171 which are adjacent to each other. The period α and the length d of each of the diffraction patterns 171 are defined with reference to a cross-section cut along the imaginary line IL passing through a half point t/2 of the thickness t of each of the diffraction patterns 171.

FIG. 3 shows an example in which the plurality of diffraction patterns 171 protrude from the encapsulation layer 160 and each has a cylindrical shape in which the top surface and the bottom surface have a circle shape. The circle shape may also include an oval or a polygon that is substantially close to a circle. The plurality of diffraction patterns 171 may have various shapes. For example, the diffraction patterns 171 may protrude from the encapsulation layer 160 and have a hemisphere shape which has a circular cross-section, a hexahedron shape or a trapezoid shape which has a quadrangular cross-section, and may be holes that are engraved and pass through toward the encapsulation layer 160 and have a circular or quadrangular cross-section or the like.

Figure 7:
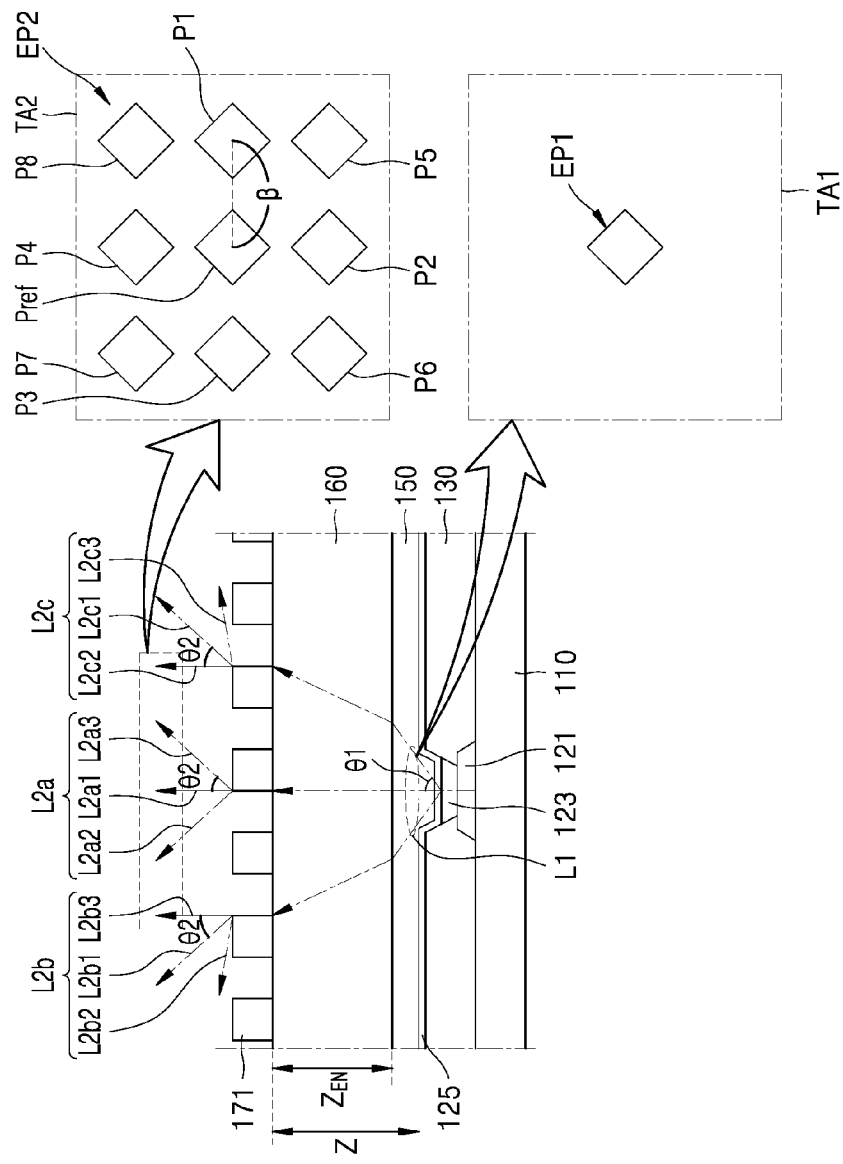
FIG. 7 is a view schematically illustrating for describing magnification of an emission area according to some example embodiments.

FIG. 7 is a view schematically illustrating for describing magnification of an emission area according to an embodiment. For convenience of explanation, some components shown in FIG. 1 are omitted.

Referring to FIG. 7, an emission pattern formed in a first area TA1 by light L1 that is emitted from the light-emitting device 120 is defined as a first emission pattern EP1, and an emission pattern formed in a second area TA2 by light that is transmitted through the diffraction pattern layer 170, that is, first diffracted light L2a, second diffracted light L2b, and third diffracted light L2c, is defined as a second emission pattern EP2. A path of the light Li may be modified at a certain angle due to refractive indices of the encapsulation layer 160 and the buffer layer 150.

The first diffracted light L2a, the second diffracted light L2b, and the third diffracted light L2c may respectively include zero-order diffracted light L2a1, L2b1, and L2c1 and first-order diffracted light L2a2, L2a3, L2b2, L2b3, L2c2, and L2c3. The zero-order diffracted light has a light path that is not changed before and after diffraction by the diffraction pattern layer 170. The first-order diffracted light is light which has a light path that is changed by the diffraction pattern layer 170 and has a second angle of diffraction 82 with reference to the zero-order diffracted light. In another embodiment, the first diffracted light L2a, the second diffracted light L2b, and the third diffraction light L2c may each further include diffracted light having an order equal to or higher than a second-order. The diffraction pattern layer 170 may generate, by diffracting the light L1, first effective light L2a1, second effective light L2b3, and third effective light L2c2 each having a light path in a vertical direction. Accordingly, the second emission pattern EP2 may have a reference emission pattern Pref and a plurality of reproduced emission patterns P1 through P8 reproduced from the reference emission pattern Pref. Here, the vertical direction may be completely vertical with reference to the first substrate 110 and may also include a direction that is substantially almost vertical. Meanwhile, when the effective light has a light path in a vertical direction to the first substrate 110, an order of diffracted light is not limited. In other words, effective light which has a light path in a vertical direction may include both zero-order diffracted light and first-order diffracted light.

Meanwhile, an area (square measure) of the first area TA1 is identical to an area (square measure) of the second area TA2. However, the number of emission patterns included in the second area TA2 is greater than the number of emission patterns included in the first area TA1. This means that an emission area in the second area TA2 is broader than an emission area in the first area TA1. In other words, it may also be expressed that an area in which light is not emitted (that is, a non-emission area) is smaller in the second area TA2 than in the first area TA1.

A relatively broad emission area may be expressed as having a high effective emission area ratio. The effective emission area (square measure) ratio is defined as a ratio of an area (square measure) of an emission pattern existing in one area to an area (square measure) of the one area. Here, an emission pattern for calculating an effective emission area ratio may include both a reference emission pattern and reproduced emission patterns. For example, the second area TA2 includes nine emission patterns, that is, the reference emission pattern Pref and the plurality of reproduced emission patterns P1 through P8, whereas the first area TA1 includes only one emission pattern. Accordingly, an effective emission area ratio of the second area TA2 is greater than an effective emission area ratio of the first area TA1. A luminance of the reference emission pattern Pref and a luminance of a first reproduced emission pattern P1 may be different from each other. However, reproduced emission patterns for calculating an effective emission area ratio may be defined as emission patterns which have a luminance that is equal to or greater than about 3% of the luminance of the reference emission pattern Pref.

A diffraction distance $\beta$ may be determined according to a distance Z between the light-emitting device 120 and the diffraction pattern layer 170, refractive indices of components between the light-emitting device 120 and the diffraction pattern layer 170 (the buffer layer 150 and the encapsulation layer 160), the period $\alpha$ of the diffraction pattern 171, a first angle of diffraction $\theta 1$ and the second angle of diffraction $\theta 2$, and the like. When a thickness of the buffer layer 150 is small enough to be ignored, the diffraction distance $\beta$ may be determined according to a thickness $Z_{EN}$ of the encapsulation layer 160, a refractive index of the encapsulation layer 160, the period $\alpha$ of the diffraction pattern 171, the second angle of diffraction $\theta 2$, and a wavelength $\lambda$ of the light L1, as shown in equations (1) and (2) below.

$$\beta = Z_{EN} \cdot \tan\left[\sin^{-1}\left(\frac{\lambda}{\alpha} \times \frac{1}{nEN}\right)\right] \quad (1)$$

$$\theta_2 = \sin^{-1}\left(\frac{\lambda}{\alpha} \times \frac{1}{nEN}\right) \quad (2)$$

Figure 8:
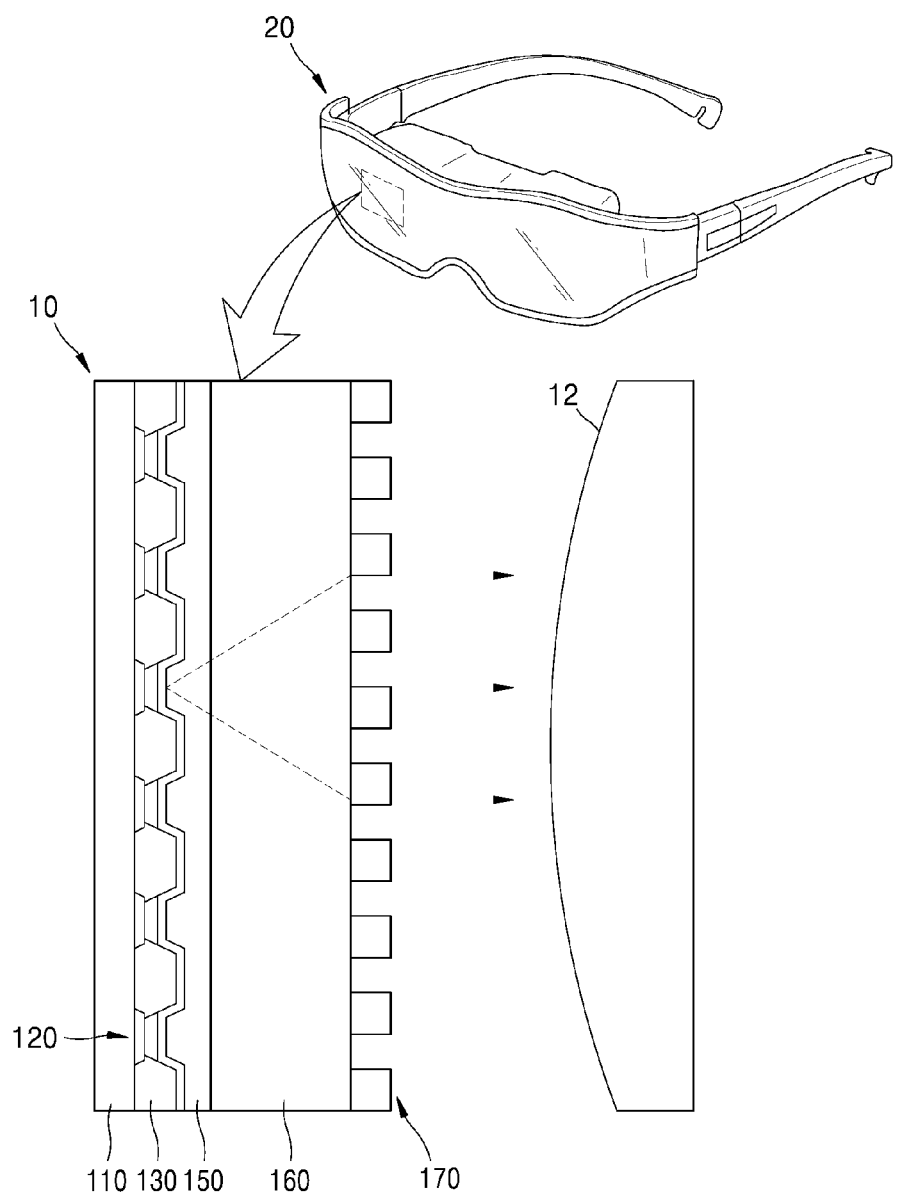
FIG. 8 shows a head-mounted display apparatus which includes the display apparatus shown in FIG. 1, according to some example embodiments.

FIG. 8 shows a head-mounted display apparatus 20 which includes the display apparatus 10 shown in FIG. 1, according to some example embodiments.

Referring to FIG. 8, the head-mounted display apparatus 20 according to some example embodiments may include the display apparatus 10 shown in FIG. 1 as a display unit and further include a lens 12.

Light may be incident from the display apparatus 10 on the lens 12. According to some example embodiments, the lens 12 may be arranged between a subject and a user. According to some example embodiments, the lens 12 may include an opaque lens to implement a virtual reality. In another embodiment, the lens 12 may include a transparent lens or a translucent lens to implement an augmented reality. Meanwhile, in an embodiment, the lens 12 may include a converging lens. The user may view an enlarged image of the display apparatus 10 through the lens 12.

Figure 9:
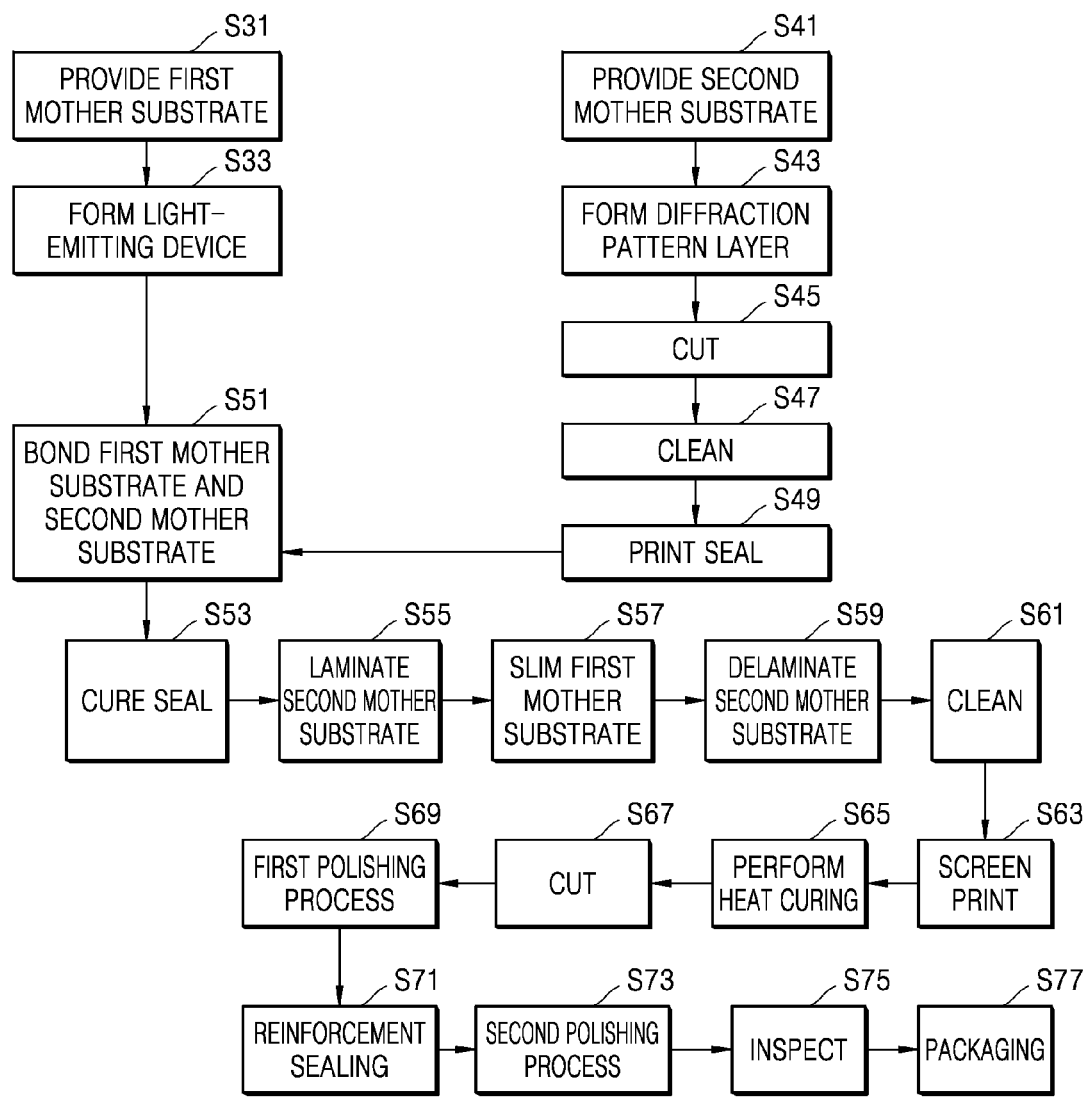
FIG. 9 is a schematic diagram showing a process of manufacturing a display apparatus according to some example embodiments.
Figure 10:
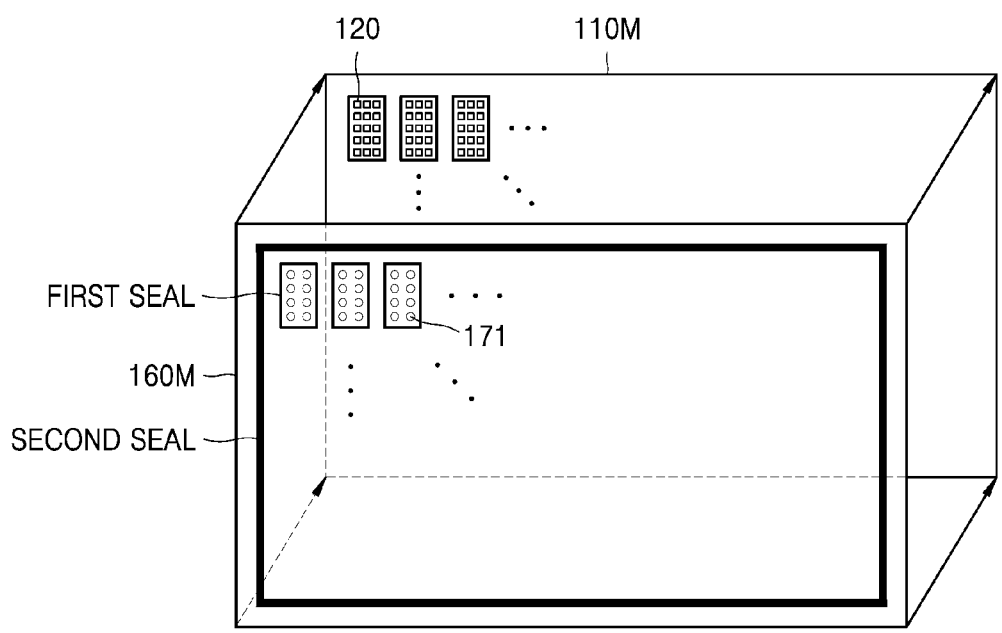
FIG. 10 is a view for describing a bonding operation from among the process shown in FIG. 9.

FIG. 9 is a schematic diagram showing a process of manufacturing the display apparatus 10 according to some example embodiments. FIG. 10 is a view for describing a bonding operation from among the processes shown in FIG. 9. In FIG. 9, an example in which the encapsulation layer 160 is an insulating substrate is described.

When a first mother substrate 110M (see FIG. 10) is provided (S31), the pixel layer including the plurality of light-emitting devices 120 may be formed on the first mother substrate 110M (S33). Pixel circuits may be formed on the first mother substrate 110M, and the light-emitting devices 120 may be formed on the pixel circuits such that the light-emitting devices 120 are electrically connected to the pixel circuits. The first mother substrate 110M may be a mother substrate which may be used for simultaneously manufacturing a plurality of substrates 110.

Meanwhile, when a second mother substrate 160M (see FIG. 10) is provided (S41), the diffraction pattern layer 170 including the plurality of diffraction patterns 171 may be formed on a surface of the second mother substrate 160M (S43). The second mother substrate 160M may be a mother substrate which may used for simultaneously manufacturing a plurality of the encapsulation layers 160. A key may be formed by depositing a metal such as molybdenum (Mo) by using a sputtering method and the like, on a surface of the second mother substrate 160M and patterning the metal, and the diffraction pattern 171 may be formed based on the key. The diffraction pattern 171 may be formed by depositing an inorganic material such as silicon dioxide ($SiO_2$) in a chemical vapor deposition (CVD) method and the like and patterning the inorganic material.

The second mother substrate 160M may be cut and divided to match a size of the first mother substrate 110M (S45). Wet cleaning and plasma cleaning may be performed on the divided second mother substrate 160M (S47). Printing and baking of a first seal and printing of a second seal may be consecutively performed on the other surface of the washed second mother substrate 160M (a surface opposite to the surface on which the diffraction patterns 171 are formed) (S49). The first seal is a panel unit seal, and the second seal is a mother substrate unit seal.

Next, as shown in FIG. 10, a bonded substrate structure may be formed by aligning the first mother substrate 110M, on which the pixel layer is formed, and the second mother substrate 160M, on which the diffraction pattern layer 170 is formed, and bonding the first mother substrate 110M and the second mother substrate 160M (S51). First seal curing and second seal curing may be performed on the bonded substrate structure (S53). The second seal may be cured with an ultraviolet ray, and the first seal may be cured with a laser.

Next, a protection film may be attached on the diffraction pattern layer 170 of the second mother substrate 160M (S55), and a slimming operation according to physical/chemical processing such as etching may be performed on the first mother substrate 110M (S57). An insulating substrate may be additionally attached on top of the protection film. A delamination operation may be performed to remove the protection film (or the insulating substrate and the protection film) of the second mother substrate 160M after the slimming operation performed on the first mother substrate 110M (S59). After the delamination operation, the bonded substrate structure may be cleaned (S61). Next, a protection layer may be formed on the first mother substrate 110M by using a screen printer (S63), and a heat curing operation may be performed on the protection layer (S65).

Next, the bonded substrate structure may be cut into a plurality of unit substrate structures (S67). A first polishing process (S69) and a second polishing process (S73) may be performed on each of the unit substrate structures. The first polishing process is a process of forming a chamfered surface on the substrate by pressing and trimming an edge surface of the unit substrate structure at a predetermined angle and in a predetermined depth. The second polishing process is a process of more delicately polishing the edge surface of the unit substrate structure. To enhance an encapsulation function, reinforcement sealing may be performed (S71) between the first polishing process and the second polishing process. Next, a defective product may be sorted out by performing a plurality of inspections on the unit substrate structures (S75), and unit substrate structures that passed the inspections may be packaged (S77).

As a plurality of subsequent operations are performed on the bonded substrate structure, a foreign material may be adsorbed by the diffraction pattern layer 170, and thus, the diffraction pattern layer 170 may be damaged. For example, the adsorption of the foreign material may be due to a cutting operation (S45) of the second mother substrate 160M before the bonding operation, a lamination operation (S55) and a delamination operation (S59) after the bonding operation, a cleaning operation (S61), a screen printing operation (S63), a cell cutting operation (S67), the first polishing process and the second polishing process (S69 and S73), and the reinforcement sealing operation (S71). Environmental factors such as a foreign material and damages to the surface result in a decrease in diffraction phenomena of the display apparatus 10, and when the display apparatus 10 is applied to the head-mounted display apparatus 20, a foreign material and the like may be viewed in an image enlarged by the lens 12.

According to some example embodiments, a foreign material prevention operation and a foreign material removal operation may be further performed on the diffraction pattern layer 170 before some of operations in which adsorption of a foreign material by the diffraction pattern layer 170 occurs, from among the processes of manufacturing the display apparatus 10. By doing so, the adsorption of the foreign material by the diffraction pattern layer 170 may be prevented and/or minimized. The foreign material prevention operation may include an operation of attaching, on the diffraction pattern layer 170, a protection member such as a sacrificial layer or a coating layer. The foreign material removal operation may include an operation of removing or cleaning the protection member whereby the foreign material is adsorbed.

Figure 11:
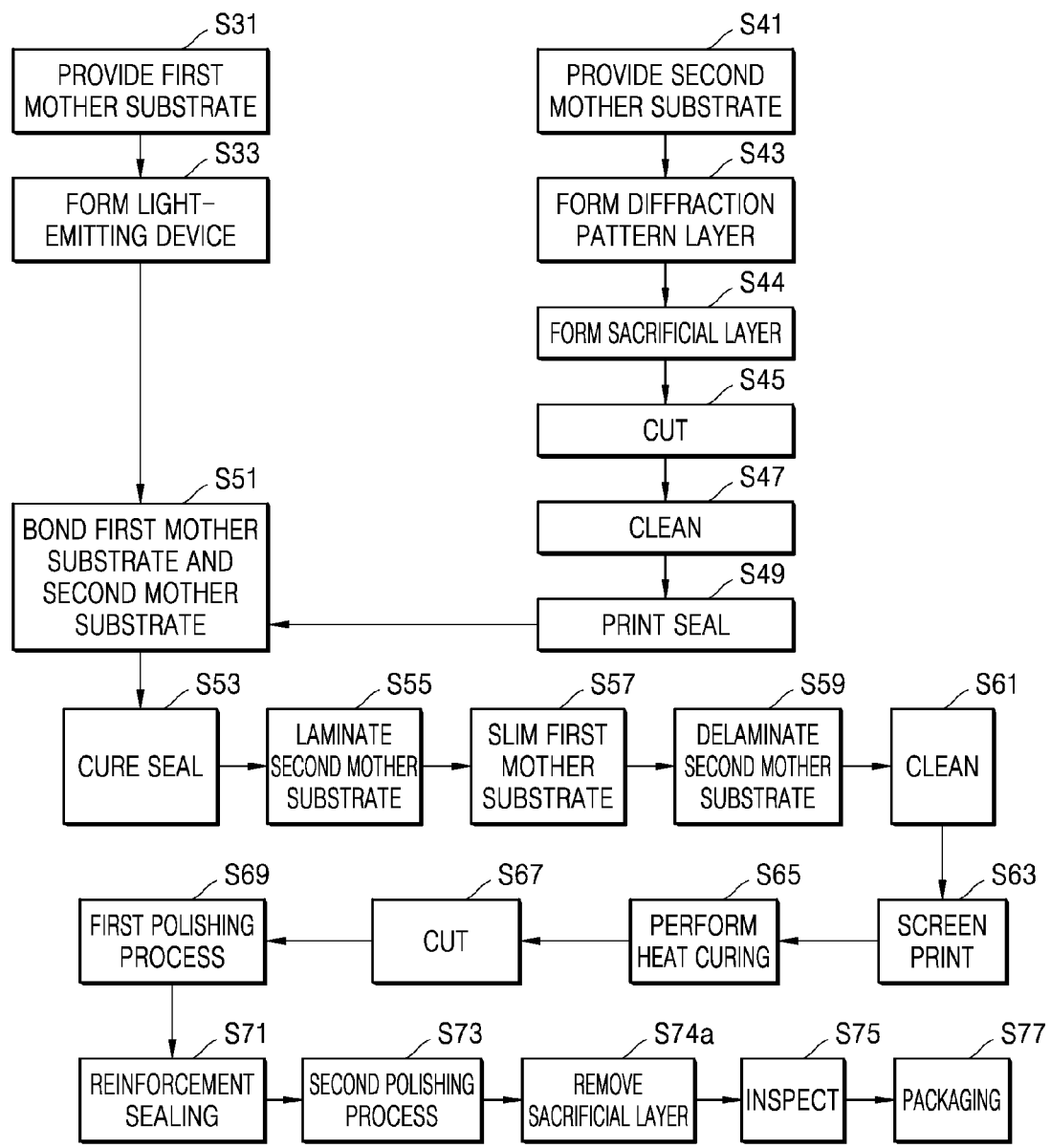
FIGS. 11 and 14 are schematic diagrams each showing a process of manufacturing a display apparatus according to some example embodiments.
Figure 12:
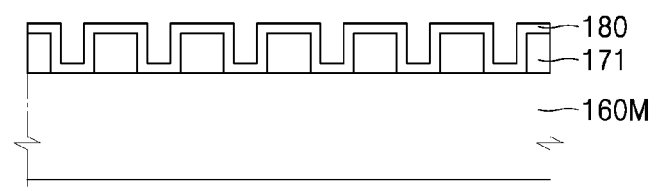
FIGS. 12, 13A, and 13B are cross-sectional views and perspective view schematically illustrating a sacrificial layer forming operation from among the process shown in FIG. 11.
Figure 13A:
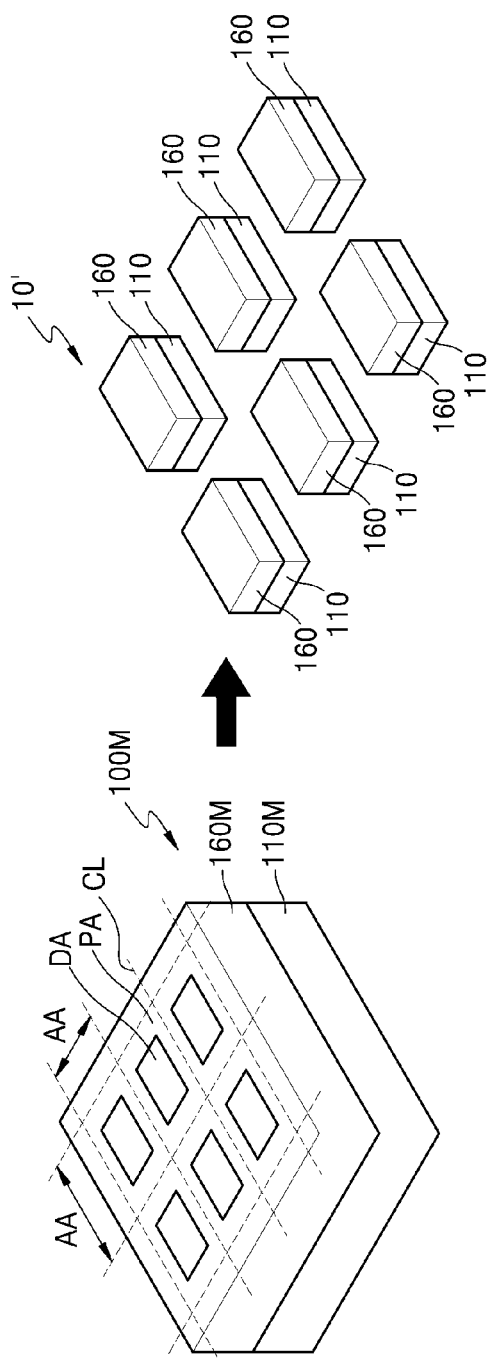
Figure 13B:
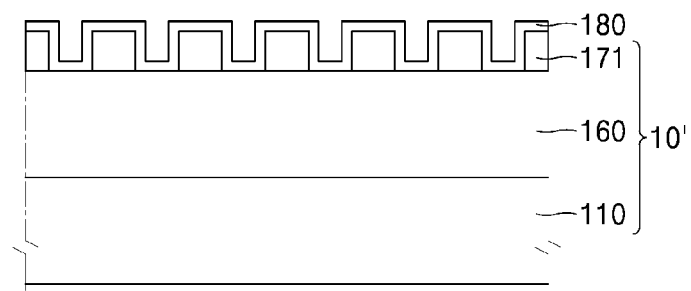

FIG. 11 is a schematic diagram showing a process of manufacturing the display apparatus 10 according to an embodiment. FIGS. 12, 13A, and 13B are cross-sectional views and perspective view schematically illustrating a sacrificial layer forming operation from among the process shown in FIG. 11.

The process of manufacturing the display apparatus 10 shown in FIG. 11 is different from the process of manufacturing the display apparatus 10 shown in FIG. 9 in that a sacrificial layer forming operation (S44) and a sacrificial layer removal operation (S74a) are additionally performed. Hereinafter, some repetitive description with reference to FIG. 9 may be omitted.

Referring to FIG. 11, when the first mother substrate 110M (see FIG. 10) is provided (S31), the pixel layer including the light-emitting devices 120 may be formed on the first mother substrate 110M (S33). Pixel circuits may be formed on the first mother substrate 110M, and the light-emitting devices 120 may be formed on the pixel circuits such that the light-emitting devices 120 are electrically connected to the pixel circuits.

Meanwhile, when a second mother substrate 160M (see FIG. 10) is provided (S41), the diffraction pattern layer 170 including the diffraction patterns 171 on a surface of the second mother substrate 160M may be formed (S43).

Next, as shown in FIG. 12, a sacrificial layer 180 which covers the diffraction pattern layer 170 may be formed on the second mother substrate 160M (S44). The sacrificial layer 180 may function as a protection member that protects the diffraction pattern layer 170 in subsequent processes. The sacrificial layer 180 may include a material that is resistant to a high temperature. For example, the sacrificial layer 180 may include a metal such as molybdenum (Mo), a conductive oxide such as indium tin oxide (ITO) and indium zinc oxide (IZO), and a coating liquid including a material that is resistant to a high temperature and may be easily separated from the diffraction pattern layer 170. The sacrificial layer 180 may be formed on the diffraction pattern layer 170 by a sputtering method.

Next, the second mother substrate 160M on which the sacrificial layer 180 is formed may be cut and divided to match a size of the first mother substrate 110M (S45). Wet cleaning and plasma cleaning may be performed on the second mother substrate 160M that is divided (S47). Printing and baking of a first seal and printing of a second seal may be consecutively performed on the other surface of the second mother substrate 160M that is cleaned (a surface opposite to the surface at which the diffraction patterns 171 are formed) (S49).

Next, as shown in FIG. 10, a bonded substrate structure may be formed by aligning the first mother substrate 110M, on which the pixel layer is formed, and the second mother substrate 160M, on which the diffraction pattern layer 170 is formed, and bonding the first mother substrate 110M and the second mother substrate 160M (S51). Curing of the first seal and the second seal may be performed on the bonding substrate structure (S53).

Next, a protection film may be attached on top of the sacrificial layer 180 of the second mother substrate 160M in the bonded substrate structure by a lamination operation (S55) and a slimming operation may be performed on the first mother substrate 110M of the bonded substrate structure by using physical/chemical processing such as etching (S57). A delamination operation may be performed to remove the protection film of the second mother substrate 160M after the slimming operation that is performed on the first mother substrate 110M (S59). Next, the bonded substrate structure may be cleaned (S61). Next, a protection layer may be formed on the first mother substrate 110M by using a screen printer (S65) and a heat curing operation may be performed on the protection layer (S65).

Next, the bonded substrate structure may be cut into a plurality of unit substrate structures (S67). FIG. 13A shows an operation of cutting a bonded substrate structure into a plurality of unit substrate structures, and FIG. 13B is a diagram showing a vertical cross-section of a unit substrate structure.

Referring to FIGS. 13A and 13B, a bonded substrate structure 100M may include a plurality of array areas AA which each include a display area DA within a first seal and a peripheral area PA around the display area DA. Each array area AA corresponds to a panel unit and formed to one display apparatus. The display area DA is an area in which the light-emitting devices 120 are arranged. Diffraction patterns 171 may be arranged to correspond to at least the display area DA. The bonded substrate structure 100M may be cut along an imaginary cutting line CL, thus forming a plurality of unit substrate structures 10'. Each of the unit substrate structures 10' may include a substrate 110 in which the pixel layer is arranged, and an encapsulation layer 160 on which a diffraction pattern layer 170 and a sacrificial layer 180 are arranged.

The first polishing process (S69) and the second polishing process (S73) may be performed on each of the unit substrate structures 10'. To enhance an encapsulation function of the unit substrate structures 10', reinforcement sealing may be performed (S71) between the first polishing process and the second polishing process.

After the first polishing process (S69) and the second polishing process (S73), the sacrificial layer 180 remaining on the encapsulation layer 160 in the unit substrate structure 10' may be removed (S74). The sacrificial layer 180 may be removed by wet etching or dry etching and cleaning.

Next, a defective product may be sorted out by performing a plurality of inspection operations on the unit substrate structure 10' (S75), and those unit substrate structure 10' that passed the inspections may be packaged as the display apparatus 10 (S77) as shown in FIG. 1.

According to some example embodiments, as illustrated in FIG. 11, as the sacrificial layer 180 is formed after forming the diffraction pattern layer 170 and before bonding, following processes under high temperatures, such as seal baking, may be performed without causing damage to the diffraction pattern layer 170.

Figure 14:
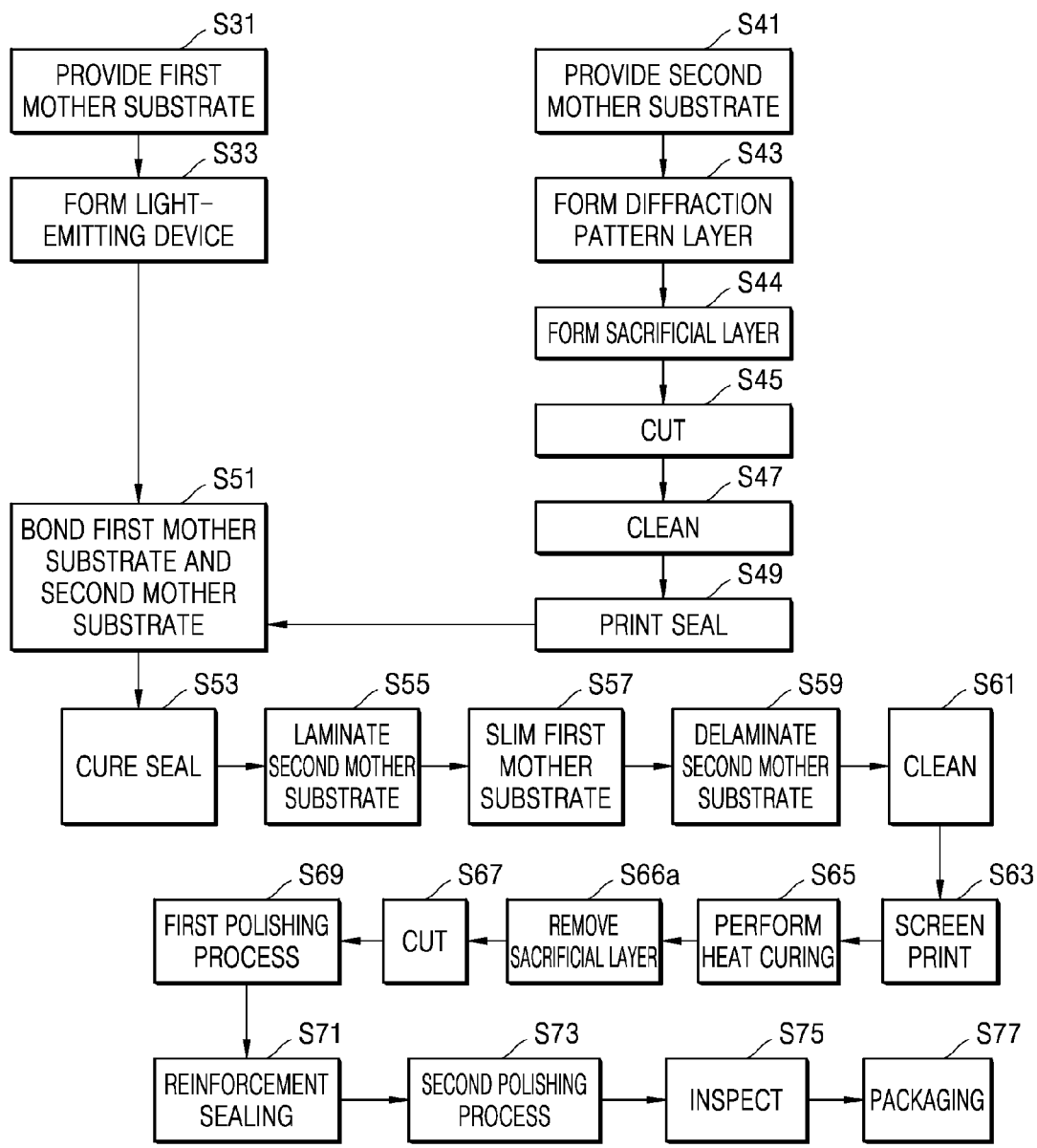

The embodiment of FIG. 11 is an example in which the sacrificial layer 180 is removed after the cutting operation (S67). According to some example embodiments, as shown in FIG. 14, the sacrificial layer 180 may be removed (S66a) before the cutting operation (S67). In a state where the sacrificial layer 180 is removed, the bonded substrate structure 100M may be cut along the cutting line CL and divided into the plurality of unit substrate structures 10'. The first polishing process (S69), the reinforcement sealing operation (S71), and the second polishing process (S73) may be consequently performed on each of the unit substrate structures 10' from which the sacrificial layer 180 is removed.

Figure 15:
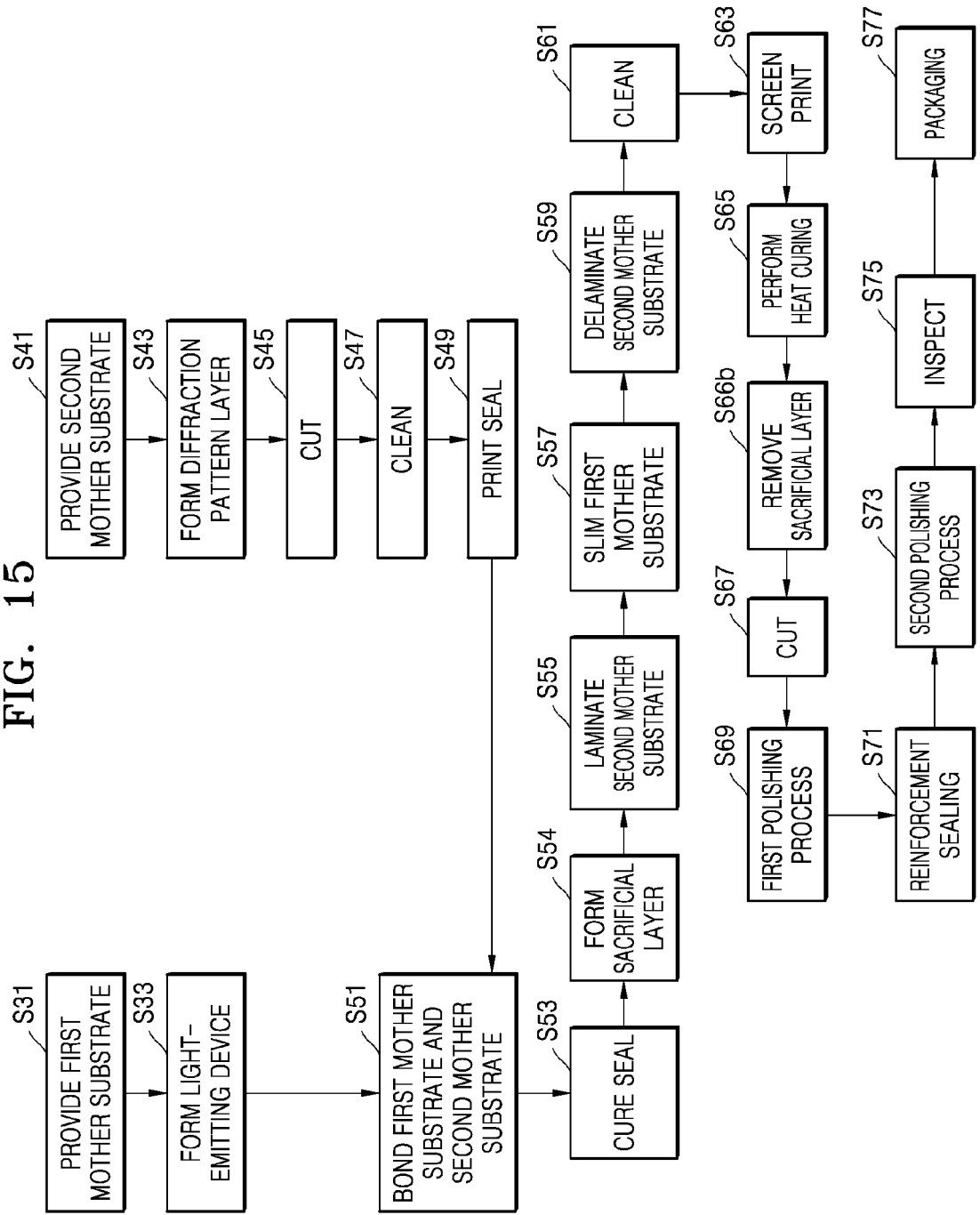
FIGS. 15 and 21 are schematic diagrams each showing a process of manufacturing a display apparatus according to some example embodiments.

FIG. 15 is a schematic diagram showing a process of manufacturing the display apparatus 10 according to an embodiment. FIGS. 16 through 20 are cross-sectional views schematically illustrating a sacrificial layer forming operation and a sacrificial layer removal operation from among the processes shown in FIG. 15.

The process of manufacturing the display apparatus 10 shown in FIG. 15 is different from the process of manufacturing the display apparatus 10 shown in FIG. 9 in that a sacrificial layer forming operation (S54) and a sacrificial layer removal operation (S66b) are additionally formed. Hereinafter, some of descriptions which repeat the description with reference to FIG. 9 will be omitted.

Referring to FIG. 15, when the first mother substrate 110M (see FIG. 10) is provided (S31), the pixel layer including the light-emitting devices 120 may be formed on the first mother substrate 110M (S33). First, pixel circuits may be formed on the first mother substrate 110M, and then, the light-emitting devices 120 may be formed on the pixel circuits such that the light-emitting devices 120 are electrically connected to the pixel circuits.

Meanwhile, when the second mother substrate 160M (see FIG. 10) is provided (S41), the diffraction pattern layer 170 including the plurality of diffraction patterns 171 may be formed on a surface of the second mother substrate 160M (S43). Next, the second mother substrate 160M may be cut and divided to match a size of the first mother substrate 110M (S45). Wet cleaning and plasma cleaning may be performed on the divided second mother substrate 160M (S47). Printing and baking of a first seal and printing of a second seal may be consecutively performed on the other surface of the second mother substrate 160M (a surface opposite to the surface on which the diffraction patterns 171 are formed) (S49).

Next, as shown in FIG. 10, the bonding substrate structure may be formed by aligning the first mother substrate 110M, on which the pixel layer is formed, and the second mother substrate 160M, on which the diffraction pattern layer 170 is formed, and bonding the first mother substrate 110M and the second mother substrate 160M (S51). Curing of the first seal and the second seal may be performed on the bonded substrate structure (S53).

Figure 16:
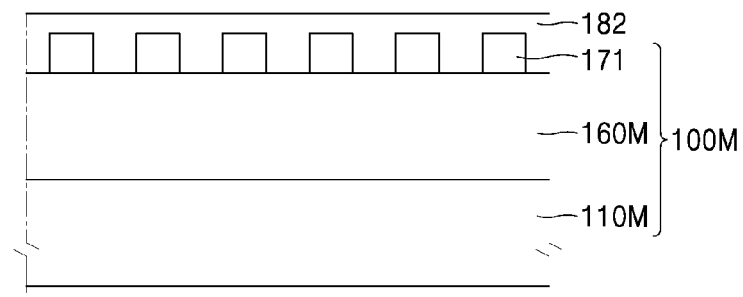
FIGS. 16 through 20 are cross-sectional views schematically illustrating a sacrificial layer forming operation and a sacrificial layer removal operation from among the process shown in FIG. 15.

Next, as shown in FIG. 16, a sacrificial layer 182 covering the diffraction pattern layer 170 may be formed on the second mother substrate 160M of the bonded substrate structure 100M. The sacrificial layer 182 may function as a protection member that protects the diffraction patterns 171 in subsequent processes. The sacrificial layer 182 may be formed by printing, coating, or depositing a metal material, an organic material, or an inorganic material on the diffraction pattern layer 170. A photo process, a sputtering process, and the like may be used for deposition. Methods such as a screen printing method, an inkjet printing method, a dot printing method, a dip-coating method, a spray coating method, a spin-coating method, and the like may be used for printing or coating. In the embodiment of FIG. 15, as the sacrificial layer 182 is formed after the bonding, an organic material or an inorganic material that is processed at a low temperature may be used as the sacrificial layer 182.

Figure 17:
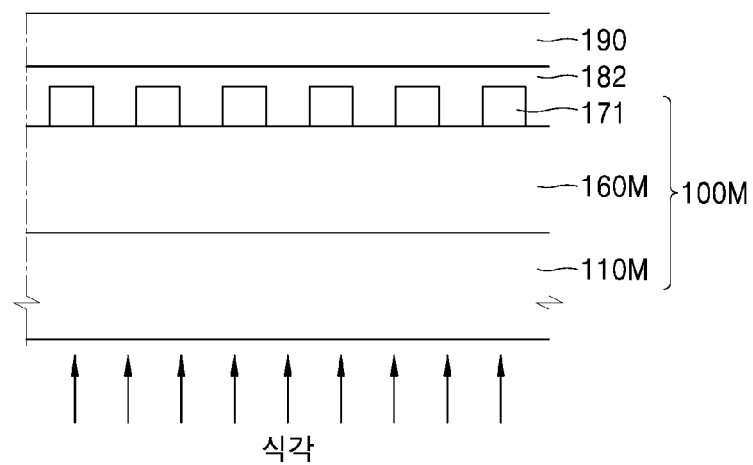

As shown in FIG. 17, a protection film 190 may be attached on top of the sacrificial layer 182 on the second mother substrate 160M of the bonded substrate structure 100M by a lamination operation (S55), and a slimming operation may be performed by using a physical/chemical processing such as etching the first mother substrate 110M of the bonded substrate structure 100M (S57). After the slimming operation is performed on the first mother substrate 110M, a delamination operation may be performed to remove the protection film 190 above the second mother substrate 160M (S59). Next, as shown in FIG. 18, the bonded substrate structure 100M to which the sacrificial layer 182 is attached may be cleaned (S61).

Figure 19:
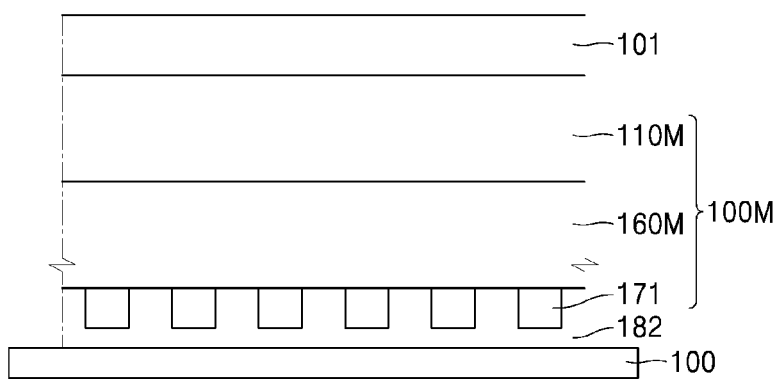

Next, as shown in FIG. 19, a protection layer 101 may be formed on the first mother substrate 110M by using a screen printer (S63) and a heat curing operation may be performed on the protection layer 101 (S65). The bonded substrate structure 100M may be mounted on a stage 100 such that the sacrificial layer 182 faces the stage 100, and the protection layer 101 may be formed on the first mother substrate 110M by using the screen printer.

Figure 20:
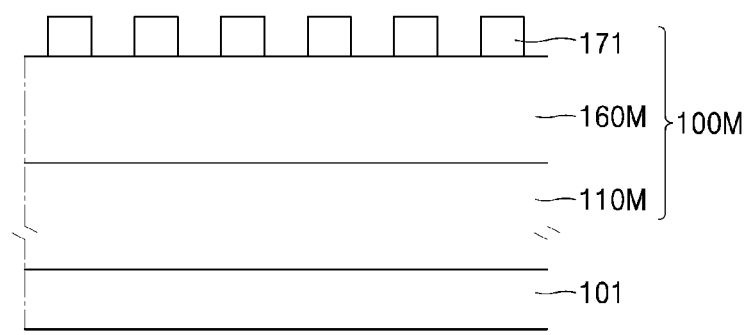

As shown in FIG. 20, the sacrificial layer 182 of the bonded substrate structure 100M may be removed (S74). The sacrificial layer 182 may be removed by a strip process, an etching process, a delamination process, and the like, and there is no particular limitation for a process of removing the sacrificial layer 182.

Figure 18:
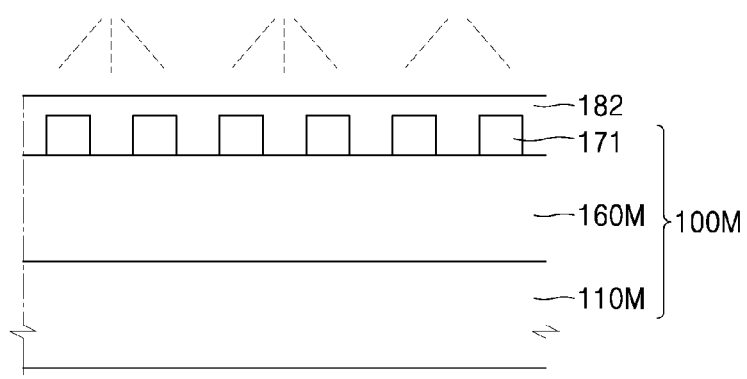

The embodiments shown in FIGS. 17 through 19 may be equally applied to the embodiment shown in FIG. 11. For example, similarly to the embodiment of FIG. 17, the protection film 190 may be attached on top of the sacrificial layer 180 of the second mother substrate 160M by a lamination process (S55), a slimming operation may be performed on the first mother substrate 110M (S57). Similarly to the embodiment of FIG. 18, the protection film 190 above the second mother substrate 160M may be removed (S59) and the second mother substrate 160M may be cleaned (S61). Next, similarly to FIG. 19, the protection layer 101 may be formed on the first mother substrate 110M by using a screen printer (S63) and a heat curing operation may be performed on the protection layer 101.

Referring back to FIG. 15, the bonded substrate structure 100M, from which the sacrificial layer 182 is removed, may be cut into the plurality of unit substrate structures 10' (see FIG. 13B) (S67). Each of the unit substrate structures 10' may include the substrate 110, on which the light-emitting devices 120 are arranged, and the encapsulation layer 160 on which the diffraction patterns 171 are arranged.

The first polishing process (S69) and the second polishing process (S73) may be performed on each of the unit substrate structures 10'. To enhance an encapsulation function of the unit substrate structure 10', a reinforcement sealing operation may be performed between the first polishing process and the second polishing process (S71).

Next, a defective product is sorted out by performing a plurality of inspection operations on the unit substrate structure 10' (S75), and those unit substrate structure 10' that passed the inspections may be packaged (S77) as the display apparatus 10 as shown in FIG. 1.

Figure 21:
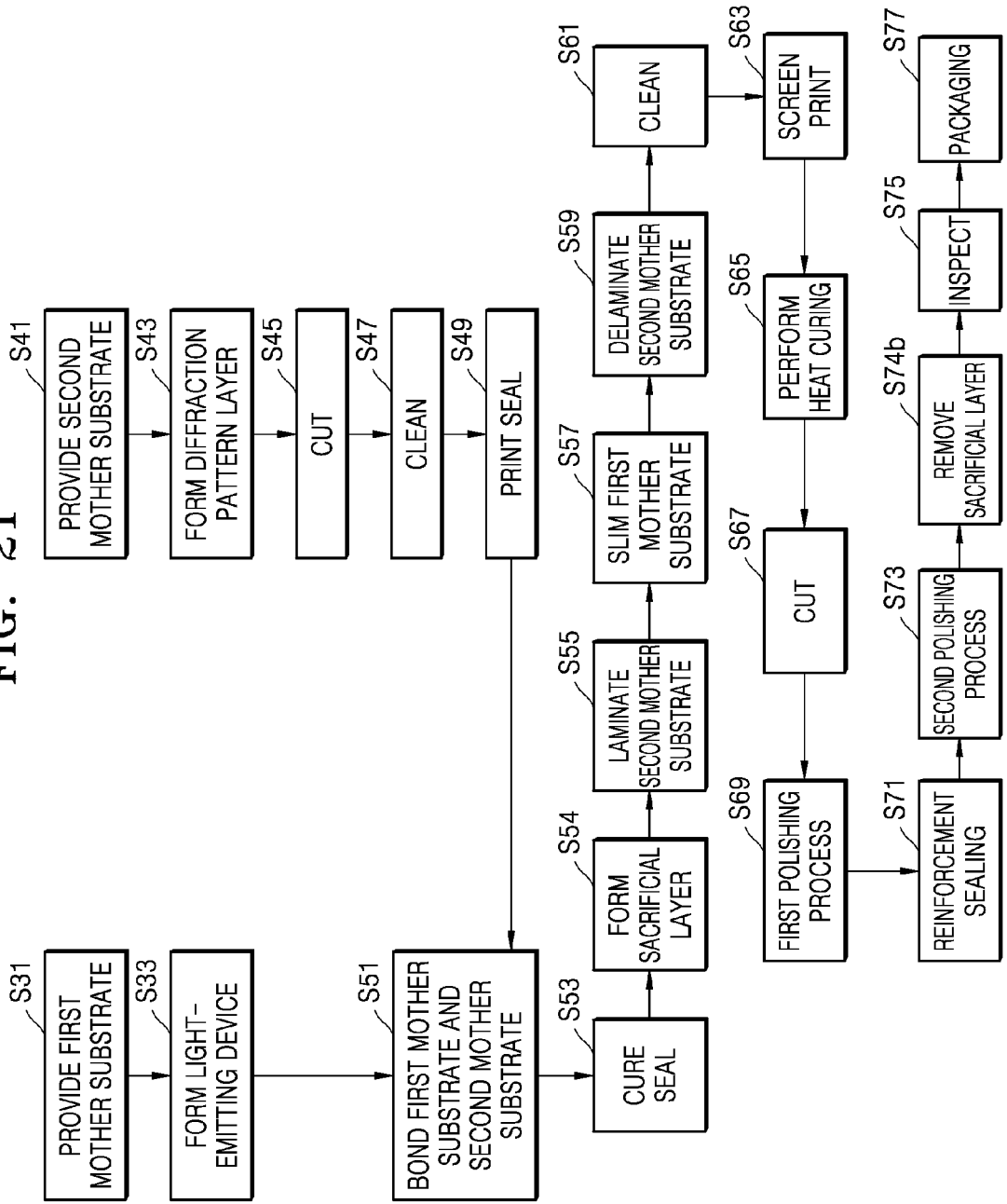

The embodiment shown in FIG. 15 is an example in which the sacrificial layer 182 is removed before the cutting operation (S67). According to some example embodiments, as shown in FIG. 21, the sacrificial layer 182 may be removed (S74b) after the cutting operation (S67). In a state where the sacrificial layer 182 is attached to the bonded substrate structure 100M, the bonded substrate structure 100M may be cut along the cutting line CL and divided into the plurality of unit substrate structures 10'. The first polishing process (S69), the reinforcement sealing operation (S67), and the second polishing process (S73) may be consecutively performed on each of the unit substrate structures 10' to which the sacrificial layer 182 is attached.

Figure 22:
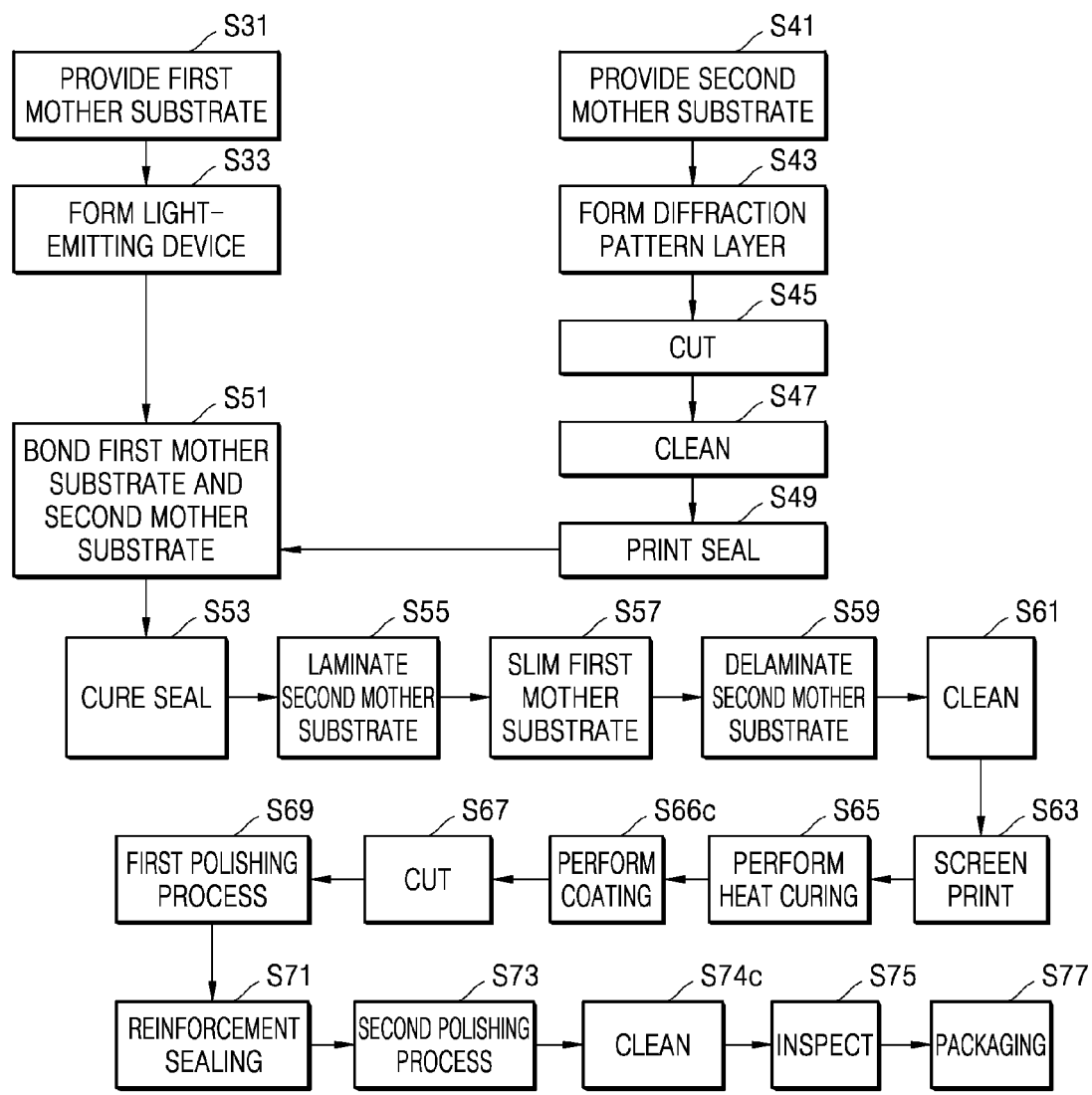
FIG. 22 is a schematic diagram showing a process of manufacturing a display apparatus according to some example embodiments.
Figure 23:
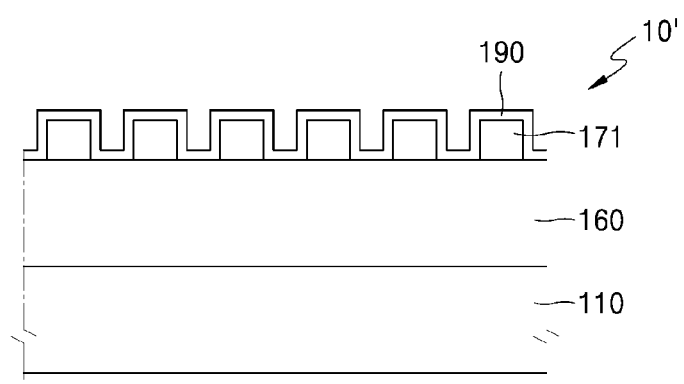
FIG. 23 is a cross-sectional view schematically illustrating a display apparatus formed according to the process shown in FIG. 22.

FIG. 22 is a schematic diagram showing a process of manufacturing the display apparatus 10 according to an embodiment. FIG. 23 is a diagram showing the display apparatus 10 formed according to the processes shown in FIG. 22.

The process of manufacturing the display apparatus of FIG. 22 is different from the process shown in FIG. 9 in that a coating operation (S66c) and a cleaning process (S74c) are added. Hereinafter, description of some of the details described above with reference to FIG. 9 is omitted.

Referring to FIG. 22, when the first mother substrate 110M (see FIG. 10) is provided (S31), the pixel layer including the light-emitting devices 120 may be formed on the first mother substrate 110M (S33). First, pixel circuits may be formed on the first mother substrate 110M, and then, the light-emitting devices 120 may be formed on the pixel circuits such that the light-emitting devices 120 are electrically connected to the pixel circuits.

Meanwhile, when the second mother substrate 160M (see FIG. 10) is provided (S41), the diffraction pattern layer 170 including the diffraction patterns 171 may be formed on a surface of the second mother substrate 160M (S43). Next, the second mother substrate 160M may be cut and divided to match the size of the first mother substrate 110M (S45). Wet cleaning and plasma cleaning may be performed on the second mother substrate 160M (S47). Printing and baking of the first seal and printing of the second seal may be consecutively performed on the other surface of the cleaned second mother substrate 160M (a surface opposite to the surface at which the diffraction patterns 171 are formed) (S49).

Next, as shown in FIG. 10, the bonded substrate structure may be formed by aligning the first mother substrate 110M, on which the pixel layer is formed, and the second mother substrate 160M, on which the diffraction pattern layer 170 is formed, and bonding the first mother substrate 110M and the second mother substrate 160M (S51). Curing of the first seal and the second seal may be performed on the bonded substrate structure (S53).

Next, a protection film may be attached on top of the diffraction pattern layer 170 of the second mother substrate 160M by a lamination process (S55) and a slimming operation according to physical/chemical processing such as etching may be performed on the first mother substrate 110M (S57). A delamination operation may be performed to remove the protection film above the second mother substrate 160M may be performed (S59) after the slimming operation performed on the first mother substrate 110M. After the delamination operation, the bonded substrate structure may be cleaned (S61). Next, the protection layer may be formed on the first mother substrate 110M by using a screen printer (S63), and a heat curing operation may be performed on the protection layer (S65).

Next, the coating layer 190 may be formed on the diffraction pattern layer 170 of the second mother substrate 160M. The coating layer 190 may be a function layer such as an anti-fingerprint (AF) layer. The coating layer 190 may include a water-repellent material and an oil-repellent material. The coating layer 190 may include a coating material including hydrophobic and oleophobic components to prevent fingerprints attached to a surface of the diffraction pattern layer 170 or stains, and scratches thereon. The coating layer 190, which includes a scratch-resistant and fingerprint-resistant component, may be formed by printing, coating, or depositing a water repellent/oil repellent material mainly including fluorine and on the diffraction pattern layer 170 and hardening the water repellent/oil repellent material at a low temperature. A photo process, a sputtering process, and the like may be used for deposition. Methods such as a screen printing method, an inkjet printing method, a dot printing method, a dip-coating method, a spray coating method, a spin-coating method, and the like may be used for printing or coating. The coating layer 190 may have a thickness which is not likely to affect characteristics of a display apparatus that is eventually manufactured even when the coating layer 190 remains. The coating layer 190 may have a thickness of about 100 nm.

The bonded substrate structure 100M to which the coating layer 190 is attached may be cut into the plurality of unit substrate structures 10' (see FIG. 13A) (S67). Each of the unit substrate structures 10' may include the substrate 110, on which the light-emitting devices 120 are arranged, and the encapsulation layer 160 on which the diffraction patterns 171 are arranged.

The first polishing process (S69) and the second polishing process (S73) may be performed on each of the unit substrate structures 10'. To enhance an encapsulation function of the unit substrate structures 10', a reinforcement sealing operation may be performed between the first polishing process and the second sealing process (S71).

Next, a foreign material attached to the coating layer 190 may be removed by cleaning the unit substrate structures 10' (S74*c*). At this time, the coating layer 190 is not removed and still remains. After cleaning, a defective product is sorted out by performing a plurality of inspection operations on the unit substrate structures 10' (S75), and those unit substrate structures 10' that passed the inspections may be packaged as the display apparatus 10 (S77) as shown in FIG. 1.

The embodiment shown in FIG. 22 is an example in which the coating layer 190, which is formed before the cutting operation (S67), remains without being removed. As shown in FIG. 23, the coating layer 190 may perform a protection function with respect to the diffraction pattern layer 170, and an anti-scratch function/anti-fingerprint function.

Figure 24:
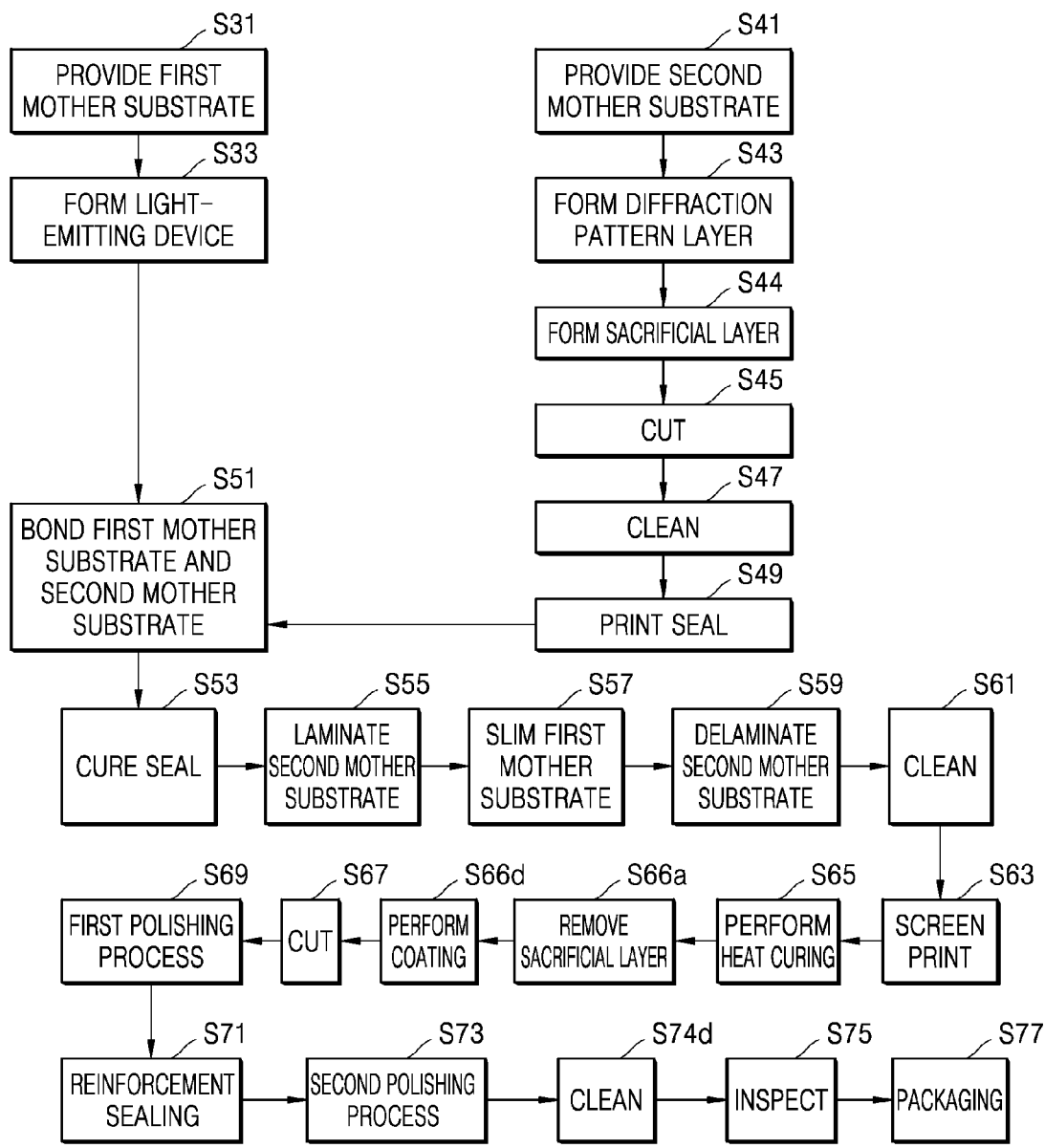
FIGS. 24 and 25 are each a schematic diagram showing a process of manufacturing display apparatus according to some example embodiments.

FIG. 24 is a schematic diagram showing a process of manufacturing the display apparatus 10 according to some example embodiments.

The embodiment shown in FIG. 24 is an example in which the sacrificial layer forming operation and the sacrificial layer removal operation of the embodiment shown in FIG. 14 and the coating layer forming operation and the coating layer cleaning operation of the embodiment shown in FIG. 22 are combined. Referring to FIG. 24, first, the sacrificial layer removal operation (S44) may be performed on the diffraction pattern layer 170 after the diffraction pattern layer 170 is formed (S43) and before the bonding operation (S51), and a sacrificial layer removal operation (S66*a*) may be performed before the cutting operation (S67). Next, a coating layer forming operation (S66*d*) may be performed after the sacrificial layer removal operation (S66*a*), and a coating layer cleaning operation (S74*d*) may be performed after the first polishing process (S69), the reinforcement sealing operation (S71), and the second polishing operation (S73).

Figure 25:
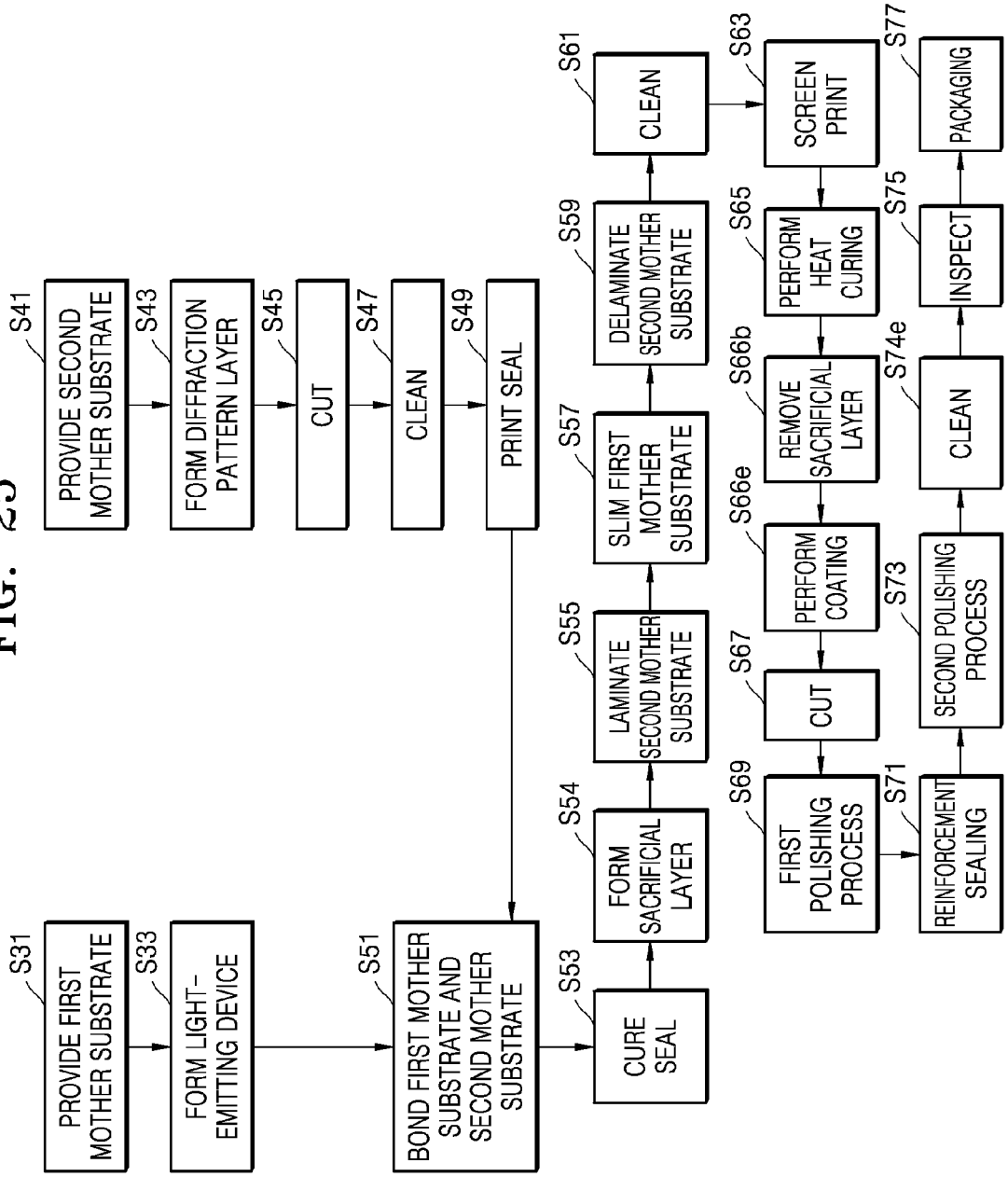

FIG. 25 is a schematic diagram showing a process of manufacturing the display apparatus according to some example embodiments.

The embodiment shown in FIG. 25 is an example in which the sacrificial layer forming operation and the sacrificial layer removal operation as in the embodiment shown in FIG. 15 and the coating layer forming operation and the coating layer cleaning operation in the embodiment shown in FIG. 22 are combined. Referring to FIG. 25, first, after the bonding process (S51), the sacrificial layer forming operation (S54) may be performed on top of the diffraction pattern layer 170 and the sacrificial layer removal process (S66*b*) may be performed before the cutting operation (S67). Subsequently, a coating layer forming operation (S66*e*) may be performed after the sacrificial layer removal operation (S66*b*), and a coating layer cleaning process (S74*e*) may be performed after the first polishing process (S69), the reinforcement sealing operation (S71), and the second polishing process (S73).

The process of manufacturing a display apparatus according to the embodiments are described in a descriptive sense, and some operations may be omitted or added according to components having various functions included in the display apparatus. The embodiments may be applied to a method of manufacturing a display apparatus, in which at least one operation that affects a diffraction pattern is performed after an operation of forming the diffraction pattern on an encapsulation layer.

According to the display apparatus of the embodiments, defects of a product may be reduced and the yield may be improved by reducing a foreign material generated in the process.

According to some example embodiments, a display apparatus in which an effective emission area ratio is increased may be provided. Effects of the embodiments are not limited to the above-written descriptions, and various effects are further included in the specification.

It should be understood that embodiments described herein should be considered in a descriptive sense only and not for the purpose of limitation. Descriptions of features or aspects within each embodiment should be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims, and their equivalents.

What is claimed is:

1. A method of manufacturing a display apparatus, the method comprising:
   providing a first mother substrate;
   forming, on the first mother substrate, a pixel layer comprising a light-emitting device;
   providing a second mother substrate;
   forming, on the second mother substrate, a diffraction pattern layer configured to diffract light emitted from the light-emitting device;
   forming a bonded substrate structure by bonding the first mother substrate, on which the pixel layer is formed, and the second mother substrate, on which the diffraction pattern layer is formed;
   forming, by cutting the bonded substrate structure, a plurality of unit substrate structures each comprising a first substrate on which the pixel layer is formed and a second substrate on which the diffraction pattern layer is formed;
   forming a protection member on the diffraction pattern layer; and
   removing a foreign material on the diffraction pattern layer with the protection member.

2. The method of claim 1, wherein the forming of the protection member comprises forming a sacrificial layer on the diffraction pattern layer, and
   the removing of the foreign material comprises removing the sacrificial layer.

3. The method of claim 1, wherein the forming of the protection member comprises forming a coating layer above the diffraction pattern layer, and the removing of the foreign material comprises cleaning the coating layer.

4. The method of claim 1, wherein the forming of the protection member comprises forming a sacrificial layer that covers the diffraction pattern layer, between the forming of the diffraction pattern layer and the forming of the bonded substrate structure; and
the removing of the foreign material comprises removing the sacrificial layer after the forming of the plurality of unit substrate structures.

5. The method of claim 4, further comprising, between the forming of the sacrificial layer and the forming of the bonded substrate structure, performing seal printing and baking on a surface opposite to a surface on which the sacrificial layer of the second mother substrate is formed.

6. The method of claim 4, further comprising, between the forming of the bonded substrate structure and the forming of the plurality of unit substrate structures:
forming a first protection layer on the sacrificial layer of the second mother substrate;
slimming the first mother substrate;
removing the first protection layer of the second mother substrate;
cleaning the bonded substrate structure; and
forming a second protection layer on the first mother substrate.

7. The method of claim 4, further comprising, between the forming of the plurality of unit substrate structures and the removing of the sacrificial layer, polishing the plurality of unit substrate structures.

8. The method of claim 1, wherein the forming of the protection member comprises, between the forming of the diffraction pattern layer and the forming of the bonded substrate structure, forming a sacrificial layer covering the diffraction pattern layer; and
the removing of the foreign material comprises, between the forming of the bonded substrate structure and the forming of the plurality of unit substrate structures, removing the sacrificial layer.

9. The method of claim 8, further comprising, between the forming of the bonded substrate structure and the removing of the sacrificial layer:
forming a first protection layer on the sacrificial layer of the second mother substrate;
slimming the first mother substrate;
removing the first protection layer of the second mother substrate;
cleaning the bonded substrate structure; and
forming a second protection layer on the first mother substrate.

10. The method of claim 9, further comprising forming the plurality of unit substrate structures after the removing of the sacrificial layer.

11. The method of claim 1, wherein the forming of the protection member comprises forming a sacrificial layer which covers the diffraction pattern layer after the forming of the bonded substrate structure, and
the removing of the foreign material comprises, between the forming of the sacrificial layer and the forming of the plurality of unit substrate structures, removing the sacrificial layer.

12. The method of claim 11, further comprising, between the forming of the sacrificial layer and the removing of the sacrificial layer:
forming a first protection layer on the sacrificial layer of the second mother substrate;
slimming the first mother substrate;
removing the first protection layer of the second mother substrate;
cleaning the bonded substrate structure; and
forming a second protection layer on the first mother substrate.

13. The method of claim 11, further comprising forming the plurality of unit substrate structures after the removing of the sacrificial layer.

14. The method of claim 1, wherein the forming of the protection member comprises, between the forming of the bonded substrate structure and the forming of the plurality of unit substrate structures, forming a sacrificial layer which covers the diffraction pattern layer, and
the removing of the foreign material comprises removing the sacrificial layer after the forming of the plurality of unit substrate structures.

15. The method of claim 14, further comprising, between the forming of the sacrificial layer and the forming of the plurality of unit substrate structures:
forming a first protection layer on the sacrificial layer of the second mother substrate;
slimming the first mother substrate;
removing the first protection layer of the second mother substrate;
cleaning the bonded substrate structure; and
forming a second protection layer on the first mother substrate.

16. The method of claim 1, wherein the forming of the protection member comprises forming a coating layer which covers the diffraction pattern layer, between the forming of the bonded substrate structure and the plurality of unit substrate structures, and
the removing of the foreign material comprises cleaning the coating layer after the forming of the plurality of unit substrate structures.

17. The method of claim 16, further comprising, between the forming of the bonded substrate structure and the forming of the plurality of unit substrate structures:
forming a first protection layer above the diffraction pattern layer of the second mother substrate;
slimming the first mother substrate;
removing the first protection layer of the second mother substrate;
cleaning the bonded substrate structure; and
forming a second protection layer on the first mother substrate.

18. The method of claim 16, further comprising, between the forming of the plurality of unit substrate structures and the cleaning of the coating layer, polishing the plurality of unit substrate structures.

* * * * *